United States Patent
Jenkins et al.

(10) Patent No.: US 8,987,844 B2
(45) Date of Patent: *Mar. 24, 2015

(54) MEMS DEVICE AND PROCESS

(71) Applicant: Wolfson Microelectronics plc, Edinburgh (GB)

(72) Inventors: Colin Robert Jenkins, Livingston (GB); Tsjerk Hans Hoekstra, Balerno (GB); Euan James Boyd, Edinburgh (GB)

(73) Assignee: Cirrus Logic International (UK) Limited, Edinburgh (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/176,811

(22) Filed: Feb. 10, 2014

(65) Prior Publication Data

US 2014/0161290 A1    Jun. 12, 2014

Related U.S. Application Data

(63) Continuation of application No. 13/974,797, filed on Aug. 23, 2013.

(60) Provisional application No. 61/704,824, filed on Sep. 24, 2012, provisional application No. 61/725,380, filed on Nov. 12, 2012.

(30) Foreign Application Priority Data

Sep. 24, 2012 (GB) .................................. 1217011.4
Aug. 21, 2013 (GB) .................................. 1314964.6

(51) Int. Cl.
*H01L 29/84* (2006.01)
*B81B 3/00* (2006.01)

(Continued)

(52) U.S. Cl.
CPC ........... *B81B 3/0021* (2013.01); *B81C 1/00158* (2013.01); *H04R 19/005* (2013.01)
USPC .............................. 257/416; 257/420; 367/181

(58) Field of Classification Search
USPC ..................................... 367/181; 257/416, 420
See application file for complete search history.

(56) References Cited

U.S. PATENT DOCUMENTS 5,652,801 A * 7/1997 Paddock ........................ 381/190
7,426,873 B1   9/2008 Kholwadwala et al.

(Continued)

FOREIGN PATENT DOCUMENTS

CN    201854425 U    6/2011
GB    2 436 460 B    9/2007

(Continued)

*Primary Examiner* — Nicholas Tobergte
(74) *Attorney, Agent, or Firm* — Dickstein Shapiro LLP

(57) ABSTRACT

A MEMS capacitive transducer with increased robustness and resilience to acoustic shock. The transducer structure includes a flexible membrane supported between a first volume and a second volume, and at least one variable vent structure in communication with at least one of the first and second volumes. The variable vent structure includes at least one moveable portion which is moveable in response to a pressure differential across the moveable portion so as to vary the size of a flow path through the vent structure. The variable vent may be formed through the membrane and the moveable portion may be a part of the membrane, defined by one or more channels, that is deflectable away from the surface of the membrane. The variable vent is preferably closed in the normal range of pressure differentials but opens at high pressure differentials to provide more rapid equalization of the air volumes above and below the membrane.

24 Claims, 14 Drawing Sheets

(51) Int. Cl.
   *B81C 1/00*    (2006.01)
   *H04R 19/00*    (2006.01)

(56) References Cited

U.S. PATENT DOCUMENTS

| | | |
|---|---|---|
| 7,900,521 B2 | 3/2011 | Hooper et al. |
| 8,359,927 B2 * | 1/2013 | Hooper et al. ............... 73/721 |
| 8,379,899 B2 * | 2/2013 | Van Halteren ............... 381/352 |
| 2008/0031476 A1 | 2/2008 | Wang et al. |
| 2009/0278217 A1 * | 11/2009 | Laming et al. ............... 257/419 |
| 2010/0327695 A1 * | 12/2010 | Goel et al. ............... 310/320 |
| 2011/0110550 A1 | 5/2011 | Bharatan et al. |
| 2011/0165717 A1 * | 7/2011 | Lee et al. ............... 438/50 |
| 2012/0090703 A1 * | 4/2012 | Li et al. ............... 137/487.5 |
| 2012/0090945 A1 * | 4/2012 | Lee et al. ............... 192/85.63 |
| 2012/0250909 A1 * | 10/2012 | Grosh et al. ............... 381/174 |
| 2013/0215931 A1 * | 8/2013 | Vaiana et al. ............... 374/178 |
| 2013/0223023 A1 | 8/2013 | Dehe et al. |
| 2013/0223654 A1 | 8/2013 | Dehe et al. |

FOREIGN PATENT DOCUMENTS

| | | |
|---|---|---|
| WO | WO 2007/107736 A2 | 9/2007 |
| WO | WO 2008/048850 A2 | 4/2008 |
| WO | WO 2011/001012 A1 | 1/2011 |
| WO | WO 2011/024397 A1 | 3/2011 |
| WO | WO 2013/021235 A1 | 2/2013 |

* cited by examiner

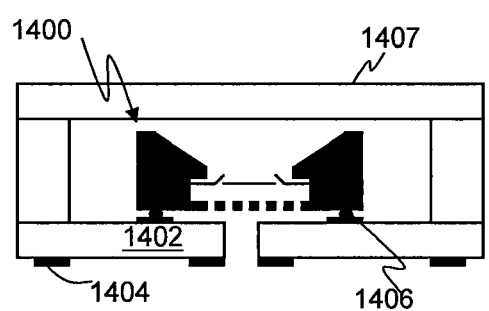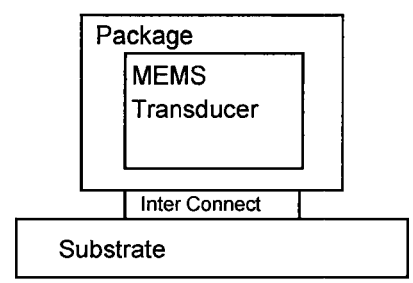
Fig. 14g
Fig. 14h

MEMS DEVICE AND PROCESS

This is a continuation of application Ser. No. 13/974,797, filed on Aug. 23, 2013, which claims the benefit of Provisional Application No. 61/704,824, filed on Sep. 24, 2012 and Provisional Application No. 61/725,380, filed on Nov. 12, 2012, the disclosures of which are incorporated herein by reference in their entireties.

BACKGROUND OF THE INVENTION

1. Field of the Invention

This invention relates to a micro-electro-mechanical system (MEMS) device and process, and in particular to a MEMS device and process relating to a transducer, for example a capacitive microphone.

2. Description of the Related Art

Various MEMS devices are becoming increasingly popular. MEMS transducers, and especially MEMS capacitive microphones, are increasingly being used in portable electronic devices such as mobile telephones and portable computing devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes. In the case of output transducers, the membrane is moved by electrostatic forces generated by varying a potential difference applied across the electrodes.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that the etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

A plurality of holes, hereinafter referred to as bleed holes 111, connect the first cavity 109 and the second cavity 110.

As mentioned the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such instances a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate.

It should also be noted that whilst FIG. 1 shows the back-plate 104 being supported on the opposite side of the membrane to the substrate 105, arrangements are known where the back-plate 104 is formed closest to the substrate with the membrane layer 101 supported above it.

In use, in response to a sound wave corresponding to a pressure wave incident on the microphone, the membrane is deformed slightly from its equilibrium position. The distance between the lower electrode 102 and the upper electrode 103 is correspondingly altered, giving rise to a change in capacitance between the two electrodes that is subsequently detected by electronic circuitry (not shown). The bleed holes allow the pressure in the first and second cavities to equalise over a relatively long timescales (in acoustic frequency terms) which reduces the effect of low frequency pressure variations, e.g. arising from temperature variations and the like, but without impacting on sensitivity at the desired acoustic frequencies.

The transducer shown in FIG. 1 is illustrated with substantially vertical side walls supporting the membrane layer 101 in spaced relation from the back-plate 104. Given the nature of the deposition process this can lead to a high stress concentration at the corners formed in the material layer that forms the membrane. Sloped or slanted side walls may be used to reduce the stress concentration. Additionally or alternatively it is known to include a number of support structures such as columns to help support the membrane in a way which reduces stress concentration as illustrated in FIGS. 2a and 2b. FIGS. 2a and 2b illustrate the periphery of a MEMS microphone structure in perspective and cross sectional views respectively, where similar components are identified by the same numerals as used in FIG. 1.

In this example the MEMS device 200 is formed with a plurality of support structures 201, which in this example are formed as supporting columns, arranged around the periphery of the membrane. The columns are formed by patterning the first sacrificial material used to define the first cavity 109 such that the substrate 105 is exposed in a number of areas before depositing the material forming the membrane layer 101 (FIG. 2b shows one membrane layer being deposited directly on the substrate but it will be appreciated that that there may be various intermediate layers on the substrate and the membrane may be formed by depositing multiple membrane layers). Likewise the second sacrificial material used to define the second cavity 110 is patterned so that membrane layer 101 is exposed in the same areas prior to depositing the material of the back-plate layer. This results in a plurality of columns being formed around the periphery of the membrane which provide support to the membrane but with a reduced stress concentration compared to the arrangement shown in FIG. 1. The columns are preferably formed with a stepped profile and/or slanted side walls to minimise stress. This process can lead to dimples in the upper surface of the back-plate layer in the area of the columns.

MEMS transducers such as those shown in FIGS. 1 and 2 may usefully be used in a range of devices, including portable devices. Especially when used for portable devices it is desirable that the MEMS transducers are sufficiently rugged to survive expected handling and use of the device. There is therefore a general desire to improve the resilience of MEMS devices.

SUMMARY OF THE INVENTION

The present invention is therefore concerned with improving the robustness and/or resilience of MEMS devices.

Thus according to an aspect of the present invention there is provided a MEMS transducer comprising a flexible membrane and at least one variable vent structure wherein the variable vent structure provides a flow path having a size that varies with pressure differential across the membrane.

The variable vent structure may comprise at least one moveable portion which is moveable in response to a pressure differential across the moveable portion so as to vary the size of a flow path through the vent structure.

The equilibrium position of the at least one moveable portion may correspond to a minimum size of flow path. The equilibrium position may correspond to the flow path being substantially closed.

The flexible membrane may be supported between a first volume and a second volume and the flow path may be between the first and second volumes. At least one variable vent structure may be formed in the flexible membrane and the flow path is a path through the membrane. The at least one moveable portion may be moveable to expose a hole in the membrane and may comprise a portion of the membrane which is able to be deflected away from the surface of the rest of the membrane. The moveable portion of the membrane may be defined by one or more channels running through the membrane. At least one the moveable portions may be generally triangular, circular or rectangular in shape. In some instances the moveable portion may be connected to the rest of the membrane via a beam structure. The beam structure may be able to twist to allow said moveable portion to be deflected away from the surface of the rest of the membrane.

The beam structure may have a non-rectilinear path, i.e. a tortuous path, for instance at least part of the beam structure may have a serpentine path or the beam structure may comprise one or more bends, such as right angled bends, within the plane of the beam. The beam structure may comprise at least one torsional spring located between the moveable portion and the rest of the membrane. The moveable portion may therefore be connected to the rest of the membrane via a spring, i.e. damping, structure, and the spring structure may be able to twist to allow said moveable portion to be deflected away from the surface of the rest of the membrane.

The beam structure may additionally or alternatively be able to bend to allow the moveable portion to be deflected away from the surface of the rest of the membrane, e.g. in a direction substantially normal to the membrane. The beam structure may comprise a leaf spring and/or have a serpentine path.

At least one variable vent structure may comprise at least two moveable portions, the at least two moveable portions being able to be deflected away from the surface of the rest of the membrane to expose a hole in the membrane.

In some embodiments the moveable portion may comprise the part of the membrane having said hole in the membrane, the membrane being moveable relative to a fixed plug portion. The fixed plug portion may lie in plane with the membrane in its equilibrium position and may be supported relative to the transducer structure. The plug portion may be supported from the substrate and the substrate may have a channel through the substrate in the vicinity of the support for the plug section or the plug portion may be supported from the back-plate. The plug portion may be formed from the same material as the membrane and/or may be thicker than the membrane.

At least one variable vent structure may be formed with a flow-path that bypasses the membrane. The flow-path may run through at least part of a sidewall of said transducer structure.

At least one variable vent may have a flow path from one of the first and/or second volumes to outside the first and/or second volumes.

The variable vent may be configured such that, at pressure differentials below a first threshold, the moveable portion is not completely deflected out of the surface of the rest of membrane. There may be substantially no movement of the moveable portion from the equilibrium position at pressure differentials below a first threshold. The first threshold may be greater than 150 Pa and may be greater than 1 kPa. The variable vent may provide substantially no significant variation in flow path size for pressure differentials in the range of 0 Pa-200 Pa.

The variable vent may provide a size of flow path through the vent that has a non-linear relationship to the pressure differential across the moveable portion.

The at least one moveable portion may be configured such that there is substantial movement of the moveable portion from the equilibrium position at pressure differentials above a second threshold. The second threshold may be lower than 100 kPa. The variable vent may provide substantially a significant increase in flow path size for pressure differentials in the range of 100 kPa-200 kPa, compared to the flow path size at equilibrium. The at least one moveable portion may be moveable in response to a pressure differential across the moveable portion of at least 100 kPa.

The transducer may comprise a back-plate structure wherein the flexible membrane layer is supported with respect to said back-plate structure. The back-plate structure may comprises a plurality of holes through the back-plate structure. When at least one variable vent structure is formed in the flexible membrane layer at least one of the holes through the back-plate structure may comprise a vent hole in a location that corresponds to the location of a variable vent structure in the flexible membrane layer. The area of the vent hole in the back-plate may extend laterally away from the area of opening of the vent in the flexible membrane at a position where the variable vent in the flexible membrane first opens. When at least one variable vent structure is formed in the flexible membrane layer and comprises a moveable portion which is connected to the rest of the membrane via a beam structure and the moveable portion and beam structure are defined by channels running through the flexible membrane; then the location of the channels in the membrane which do not form part of the variable flow path through the membrane in use may be arranged so as to not substantially overlap with the location of any of said plurality of holes in the back-plate structure.

The transducer may be a capacitive sensor such as a microphone. The transducer may comprise readout, i.e. amplification, circuitry. The transducer may be located within a package having a sound port, i.e. an acoustic port. The transducer may be implemented in an electronic device which may be at least one of: a portable device; a battery powered device; an audio device; a computing device; a communications device; a personal media player; a mobile telephone; a tablet device; a games device; and a voice controlled device.

In a further aspect the invention provides a method of fabricating a MEMS transducer having a flexible membrane, the method comprising:
forming a structure having a flexible membrane supported between a first volume and a second volume; and
forming at least one variable vent structure in communication with at least one of said first and second volumes,
said variable vent structure comprising at least one moveable portion which is moveable in response to a pressure differential across the moveable portion so as to vary the size of a flow path through the vent structure.

The method may be used to form transducer according to any of the embodiments discussed above. In particular the method may comprise forming a membrane layer to form at least part of said flexible membrane and forming at least variable vent structure in said membrane layer. Forming the variable vent structure may comprise forming one or more channels through the membrane so that a portion of the membrane can be deflected away from the surface of the rest of the membrane in response to a pressure differential.

In a further aspect of the invention there is provided a MEMS transducer comprising:
a transducer structure comprising a flexible membrane supported between a first volume and a second volume; wherein said transducer structure comprises at least one variable vent structure,
said variable vent structure comprising at least one moveable portion which is moveable in response to a high pressure differential across the moveable portion so as to provide a flow path for venting gas from at least one of said first and second volumes.

In a further aspect there is provided a MEMS transducer comprising:
a flexible membrane, and
at least one variable vent structure which is substantially closed in a first range of pressure differentials and which opens in a second higher range of pressure differentials to reduce the pressure differential across the membrane.

The invention, in another aspect, provides a MEMS transducer comprising:
a flexible membrane supported between a first volume and a second volume
a vent structure connecting said first and second volumes;
wherein said vent provides a flow path having a size that varies with pressure differential across the membrane.

In a further aspect there is a MEMS transducer comprising:
a flexible membrane supported between a first volume and a second volume
a vent connecting said first and second volumes wherein the vent is configured such that the flow rate through the vent is non-linear with respect to pressure difference.

In another aspect there is provided a MEMS transducer having a membrane supported between first and second volumes wherein the acoustic impedance between the first and second volumes is variable with the differential pressure between the volumes.

Embodiments of the invention relate to a MEMS transducer comprising:
a transducer structure comprising a flexible membrane supported between a first volume and a second volume; wherein
said transducer structure comprises at least one variable vent structure for varying the size of a flow path between said first and second volumes,
said variable vent structure comprising at least one moveable portion which is moveable with respect to a surface, wherein the moveable portion is connected to the rest of the surface by at least one torsional spring. The variable vent may be formed in said flexible membrane.

A further aspect provides a MEMS transducer comprising:
a transducer structure comprising a flexible membrane, the membrane being supported between a first volume and a second volume; wherein
said transducer structure comprises at least one variable vent structure in communication with at least one of said first and second volumes,
said variable vent structure comprising at least one moveable portion which is moveable in response to a pressure differential across the moveable portion so as to vary the size of a flow path through the vent structure.

The variable vent may be a variable aperture and thus embodiments of the invention also provide a MEMS transducer comprising: a flexible membrane; and at least one variable aperture for equalising a pressure differential across the flexible membrane.

In general there is provided a MEMS transducer that comprises at least one variable vent. The MEMs transducer may be a capacitive microphone. The transducer may have a flexible membrane and the variable vent may be formed in the flexible membrane.

BRIEF DESCRIPTION OF THE DRAWINGS

The invention will now be described by way of example only, with reference to the accompanying drawings, of which.

FIGS. 14a to 14h illustrate various arrangements for packages including a MEMS transducer.

DETAILED DESCRIPTION OF THE PREFERRED EMBODIMENTS

Figure 1A:
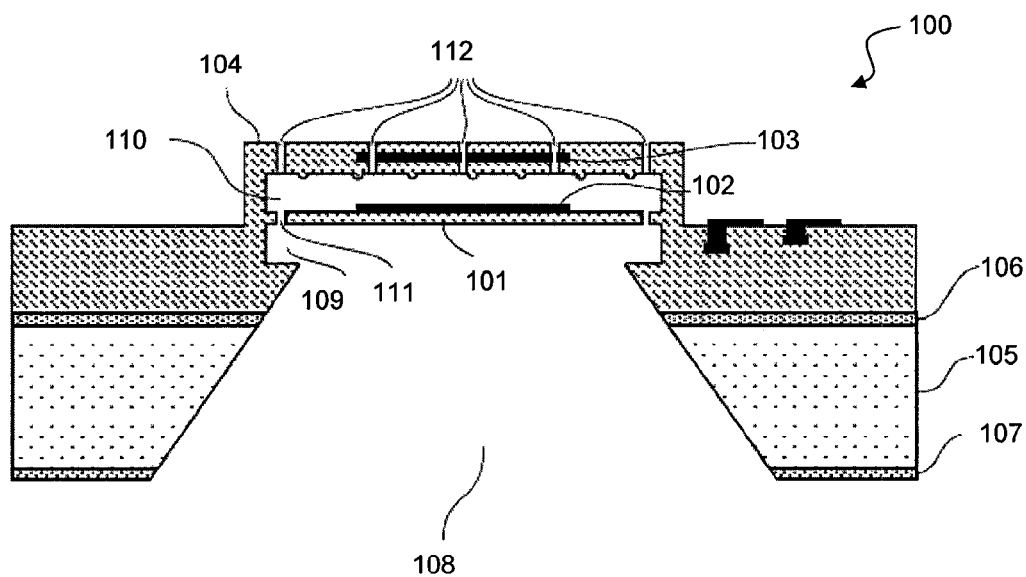
FIGS. 1*a* and 1*b* illustrate known capacitive MEMS transducers in section and cut-away perspective views.
Figure 1B:
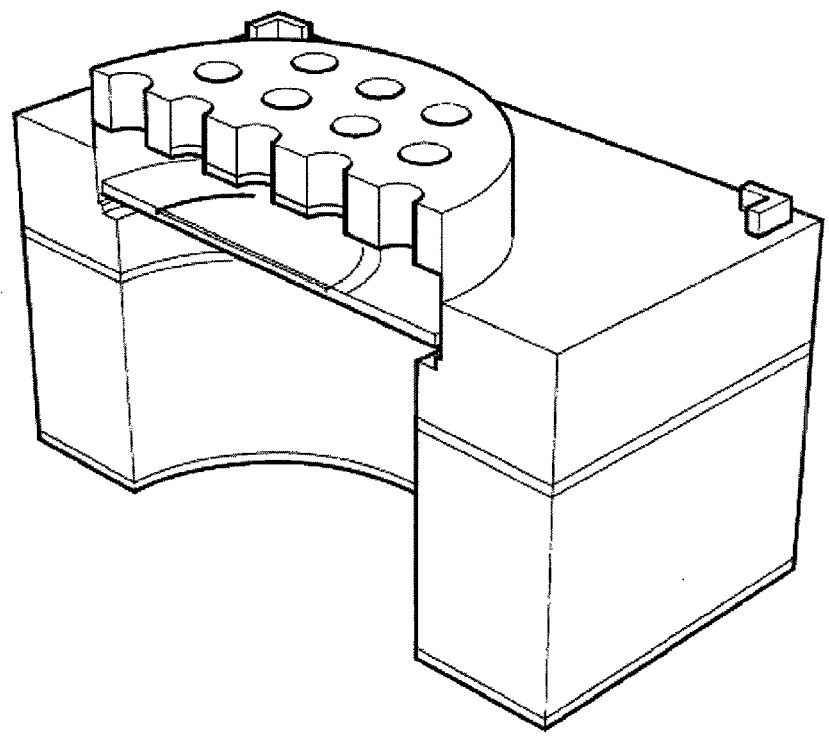

As described above MEMS transducers such as shown in FIGS. 1 and 2 may be usefully employed in a variety of different devices and increasingly are becoming popular for use in portable electronic devices such as mobile telephones, mobile computing devices and/or personal media players and the like.

To be useful for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound/acoustic port for a MEMS microphone on one face of the device. If the device falls onto that face, some air may be compressed by the falling device and forced into the sound port. This may result in a high pressure impulse incident on the transducer. It has been found that in conventional MEMS transducers of the form described above high pressure impulses can potentially lead to damage of the transducer.

Figure 2A:
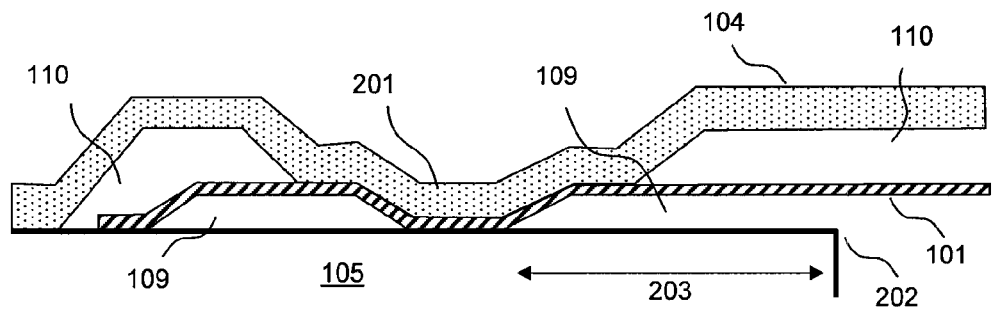
FIGS. 2*a* and 2*b* illustrate plan, sectional and perspective views of another known capacitive MEMS transducer.
Figure 2B:
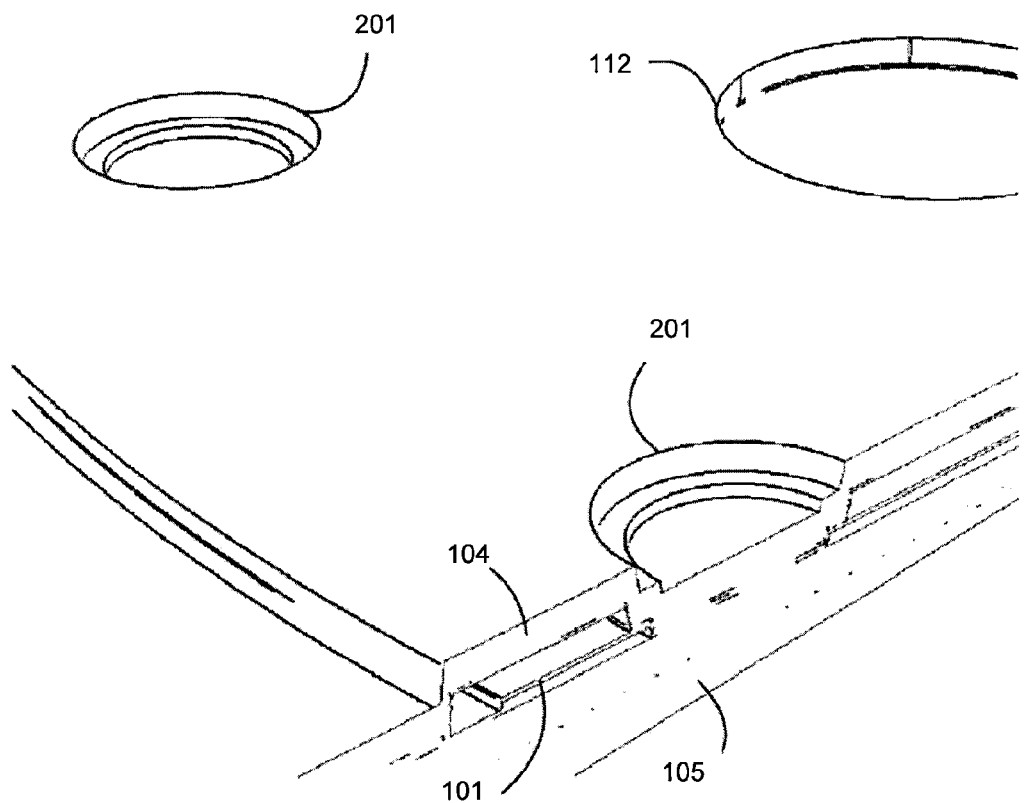

Referring again FIGS. 2a and 2b, as previously described, a MEMS transducer 200 may have a membrane layer 101 and a back-plate layer 104 formed so that a membrane is suspended above a surface of a substrate 105 to define a first cavity 109 and the back-plate 104 is suspended above the membrane to form a second cavity 110. Note as use herein the term substrate will be used to refer to the one or more layers of material above which the membrane is suspended. This may typically comprise a silicon wafer and may also include one or more deposited layers, possibly including layers of the same material used to form the membrane layer.

As mentioned above a sacrificial material may be used to define the dimensions of the first cavity and hence the dimensions of the membrane. As discussed sacrificial material may be deposited and patterned relatively accurately to provide good control over the membrane dimensions. A substrate cavity is also provided in the substrate 105, typically by means of a back etch. To ensure that it is the dimensions of the first cavity 109 which determine the membrane dimensions, the substrate cavity is arranged to have a smaller diameter than the first cavity at the point 202 where the substrate cavity and first cavity meet, in other words the opening of the substrate cavity at the surface of the substrate has a smaller diameter than the first cavity. This means that in such a structure the membrane is suspended above a section of the substrate, indicated by arrow 203, before reaching the opening of the substrate cavity, i.e. the opening of the substrate cavity 108 in the surface of the substrate is within the area of the flexible membrane.

The sacrificial material used to define the first and second cavities is dimensioned so as to provide a desired equilibrium separation between the membrane layer 101 and the substrate 105 and also between the membrane layer 101 and the back-plate 104 so as to provide good sensitivity and dynamic range in use. In normal operation the membrane may deform within the volume defined by the first and second cavities without contacting the back-plate and/or substrate 105.

Figure 3A:
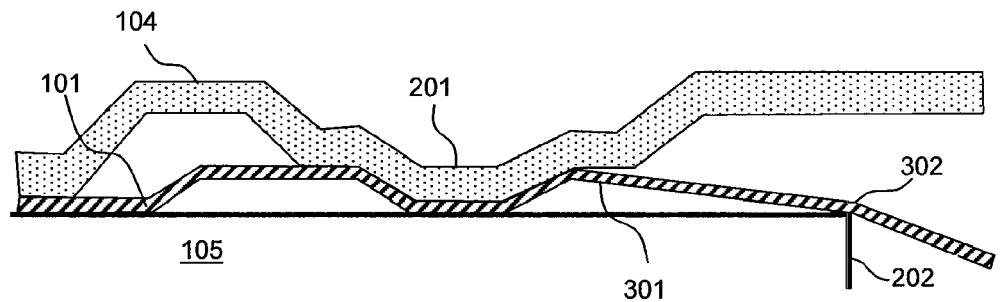
FIGS. 3*a* and 3*b* illustrate how a high pressure event may affect the membrane.
Figure 3B:
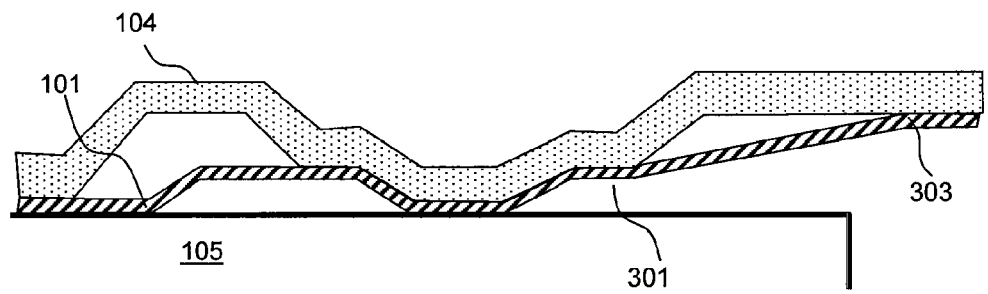

In response to a high pressure impulse however the membrane layer 101 may exhibit a greater amount of deformation than usual. FIG. 3a illustrates the situation where the membrane has been deformed downwards following a high pressure event and FIG. 3b shows the situation where the membrane has been displaced upwards.

Consider the situation where the microphone is arranged to receive incident sound from a sound port arranged above the back-plate 104 and the sound port pressure suddenly increases, for instance as a result of air trapped when the device falls being forced into the sound port. This may result the pressure in the second cavity 110 being significantly greater than the pressure in the first cavity 109, displacing the membrane downwards to greater extent than is usual. This may result in a relatively large stress at point 301 where membrane layer 101 forms part of the sidewall of supporting structure 201 and, in some instances, may thus result in delamination of the membrane layer from the rest of the sidewall structure. Further, if the pressure difference is great enough the membrane may make contact with the substrate 105 at the edge of the substrate defined by the side wall 202 of the opening of substrate cavity 1108. Typically the edge of the substrate at the location of the opening of substrate cavity has a relatively sharp angle and thus the membrane may be deformed round this edge, leading to a large stress concentration at this point 302.

As mentioned previously the membrane layer 101 will typically be formed from one or more thin layers of semiconductor material, such as silicon nitride. Whilst such a material can be flexible when subject to even stresses if there is a significant localised out-of-plane stress, such as may be introduced into the membrane at point 302 by contact with the edge of the opening of substrate cavity 108, the membrane material can be relatively brittle. Thus contact between the membrane and the edge of the opening of substrate cavity in this way can lead to damage such as cracking of the membrane.

The bleed holes (not shown in FIG. 2 or 3) discussed above with relation to FIG. 1 will provide a flow path between the first and second cavities and thus flow of air through the bleed holes will reduce the pressure differential acting on the membrane over time. However the bleed holes are typically deliberately arranged to provide a limited amount of flow so as to provide a desired frequency response. Thus a high pressure differential may be maintained across the membrane for a relatively long period of time before flow through the bleed holes acts to equalise the pressures in the first and second cavities. The time taken to equalise via the bleed holes could be changed by altering the size and/or number of bleed hole but this may impact negatively on transducer performance.

As the high pressure caused by trapped air may persist for a relatively long time, the pressure in the first and second cavities may equalise by virtue of the bleed holes as discussed. Thus the pressure in the first cavity, and substrate cavity, may increase until the pressures are equalized. However once air is no longer being forced into the sound port the pressure in the sound port will reduce quite quickly and, as typically the back-plate has a low acoustic impedance, the pressure in the second cavity will quickly reduce. At this point the pressure in the first cavity may be significantly greater than the pressure in the second cavity and thus the membrane may be deformed upwards, again to a greater extent than may usually be in the case. Again this may lead to a significant stress in region 301 where the membrane layer 101 meets the sidewall of the supporting structure. If the pressure difference is large enough the membrane may be displaced far enough to contact the back-plate 104. This may limit the amount of travel of the membrane as compared with the situation shown in FIG. 3*a* but again this may introduce stress into the membrane layer at the point 303 where it contacts the back-plate 104. Again it may take a while for this pressure differential to reduce by virtue of flow through the bleed holes.

It should be appreciated that both of these situations can also occur when sound is received via the substrate cavity 108 but in the opposite order. Whilst both situations may lead to damage of the membrane it is believed that the situation shown in FIG. 3*a* is more likely to lead to damage.

Embodiments of the present invention relate to MEMS transducers comprising a transducer structure comprising a flexible membrane supported between a first volume and a second volume. The first volume may for instance comprise the first cavity (109) between the membrane and the substrate and/or the volume formed in the substrate (108). The second volume may comprise the second cavity (110) between the membrane and back-plate and/or any volume in fluid communication with the second cavity (e.g. a sound port in top-port embodiments). To reduce the likelihood of damage in high pressure situations the transducer structure comprises at least one variable vent structure in communication with at least one of said first and second volumes. The variable vent structure comprises at least one moveable portion which is moveable in response to a pressure differential across the moveable portion so as to vary the size of a flow path through the vent structure.

The variable vent structure may comprise a moveable portion which is moveable so as to open a hole extending from the first volume to the second volume. The moveable portion may quiescently occupy at least some, and possibly most, of the area of the hole, but is moveable in response to a local pressure differential across the hole so as to vary the size of the hole which is open to provide a flow path. In other words the moveable portion may, in equilibrium, effectively close at least part of the hole, but is moveable so as to vary to degree to which the hole is closed. The moveable portion is preferably arranged to remain closing the hole, i.e. aperture, at normal operating pressure differentials but to more to increase the size of the flow path, e.g. close less of the hole, at higher pressure differentials that could potentially cause damage to the membrane. The vent can therefore be seen as a variable aperture.

The variable vent structure thus acts as a type of pressure relief valve to reduce the pressure differential acting on the membrane at relatively high pressure differentials. However unlike, the bleed holes in the membrane (if present) which have a fixed area and thus a fixed size of flow path, the variable vent has a flow path size, i.e. aperture, which varies in response to a pressure differential. Thus the degree to which the variable vent allows venting depends on the pressure differential acting on the vent—which clearly depends on the pressure of at least one of the first and second volumes. The variable vent therefore provides a variable acoustic impedance.

Conveniently the variable vent is arranged to provide a greater degree of venting at higher pressures. Thus the equilibrium position of the moveable portion, i.e. the position the moveable portion adopts when there is no substantial pressure differential, corresponds to a minimum size of flow path. The equilibrium position of the moveable portion may correspond to the flow path being substantially closed. Thus at relatively low pressure differentials, such as may be experienced in the expected normal operating range of the transducer, the variable vent may be effectively closed and/or allow only a limited amount of venting. However in a high pressure situation the moveable portion of the variable vent may move to a more open position, to provide a larger size of flow path and thus provide greater venting. This may reduce the pressure differential acting on the membrane and hence reduce the chance of damage to the membrane.

In some embodiments the flow path of at least one variable vent structure is between the first and second volumes. The variable vent may comprise (at least when open) a hole in a structure, the hole connecting the first and second volumes. Thus the variable vent may allow the pressure in the two volumes to equalise in the event of a high pressure differential between the two volumes. The variable vent may progressively open at higher pressure differentials to allow more rapid equalisation than would be the case without the variable vent. At lower pressure differentials the variable vent may provide a minimum flow path so as to not impact on device performance.

Figure 4A:
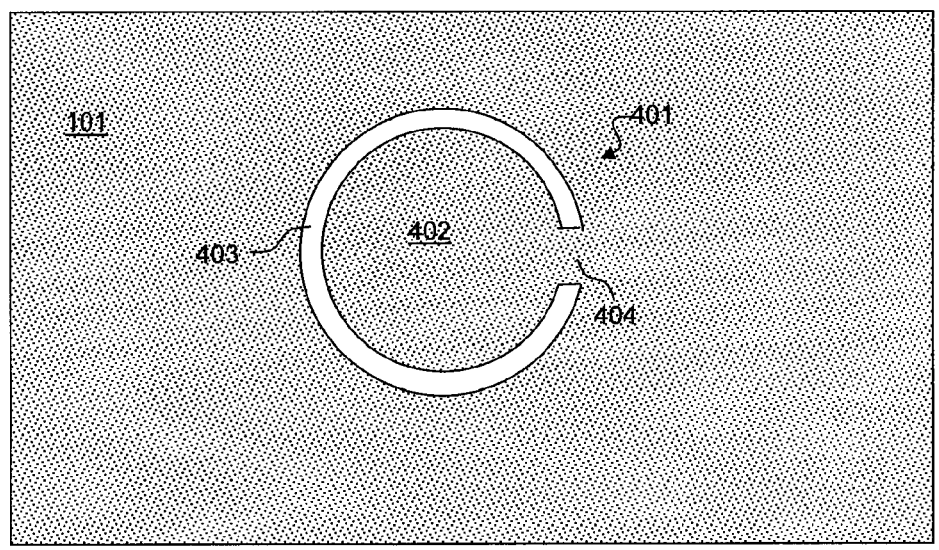
FIGS. 4*a*-4*c* illustrate a variable vent structure according to an embodiment of the invention.
Figure 4B:
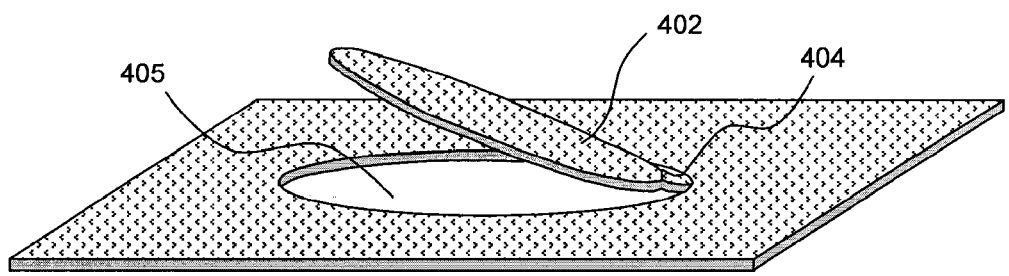
Figure 4C:
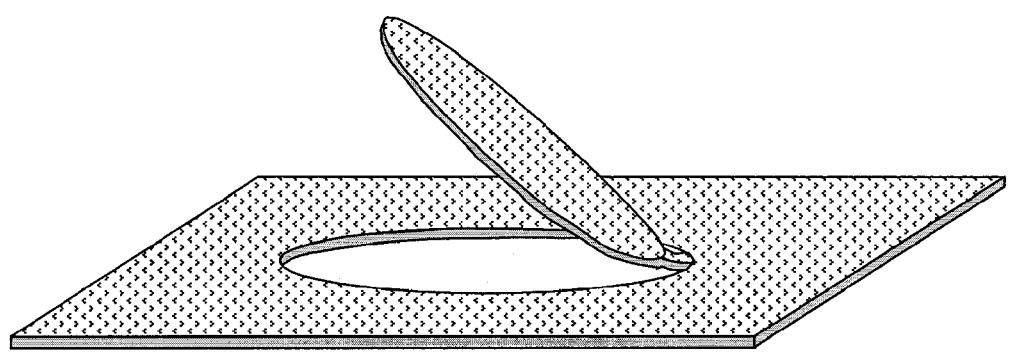

FIGS. 4*a* to 4*c* illustrate one embodiment of the invention. In this embodiment at least one variable vent structure is formed in the flexible membrane 101 and the flow path is a path through the membrane. In other words the variable vent structure may comprise a hole through the substrate and the moveable portion of the variable vent structure provides a variable degree of blocking of the hole, subject to the local pressure differential.

FIG. 4*a* illustrates a plan view of the variable vent structure 401. The variable vent structure comprises part of the membrane 101 formed as a moveable portion 402. In this embodiment the moveable portion 402 is formed as a moveable flap portion. The moveable flap portion 402 is defined by a channel 403 which runs through the membrane. The channel 403, which may be formed by etching through the membrane, is a thin channel and separates the moveable flap portion 402 partially from the rest of the membrane. The moveable flap portion remains attached to the rest of the membrane via a connecting portion 404.

Etching channels to partially separate the moveable portion 402 from the rest of the membrane in this way means that the moveable portion of the membrane may be deflected away from the surface of the rest of the membrane.

The moveable portion is preferably arranged such that its equilibrium position, i.e. the position it adopts with substantially no pressure differential acting on the moveable portion, is within the plane of the membrane. In other words the moveable portion is not substantially deflected away from the rest of the membrane at equilibrium. In this position the moveable portion 402 substantially covers the flow path through the membrane, i.e. the flow path is at a minimum size and in this embodiment is substantially closed.

It will of course be appreciated that the channel 403 does represent a path for air to flow through the membrane, however the channel 403 may be formed with a very narrow width and thus there may be no or limited air flow through the channel when the moveable flap portion is in the closed position.

The width of channel 403 may be limited by the photolithographic process constraints on the minimum etchable gap, or the need for some mechanical clearance for the moveable element(s) to bend and flex yet clear the rest of the structure. Also narrow gaps will tend to have a larger fractional manufacturing tolerance, leading to a wider variation in the acoustic impedance when closed and thus a wider variation in of e.g. the low-frequency roll-off a microphone.

A typical width might be 1 μm, relative to a typical vent structure of 20 μm to 50 μm in extent. However the width might be ten times smaller or larger depending on the acoustic specifications or the manufacturing process capability. As mentioned the line width of the channels defining the moveable vent part may influence factors such as the low-frequency roll-off. In choosing appropriate line widths the effect of different widths may be simulated and/or different designs could be fabricated and tested.

At high pressure differentials the moveable portion may be deflected out of the membrane surface and thus effectively open the flow path through the membrane. FIG. 4b illustrates in perspective view the part of the membrane and the variable vent. In this example the pressure in the volume below the membrane is sufficiently greater than the pressure in the volume above the membrane such that the moveable flap portion 402 has been deflected upwards away from the rest of the membrane surface. This opens the flow channel through the membrane, i.e. effectively opens a hole in the substrate. If the pressure differential increases enough the moveable portion 402 may be further deflected and thus provide a greater amount of opening, i.e. a greater flow path.

Figure 5:
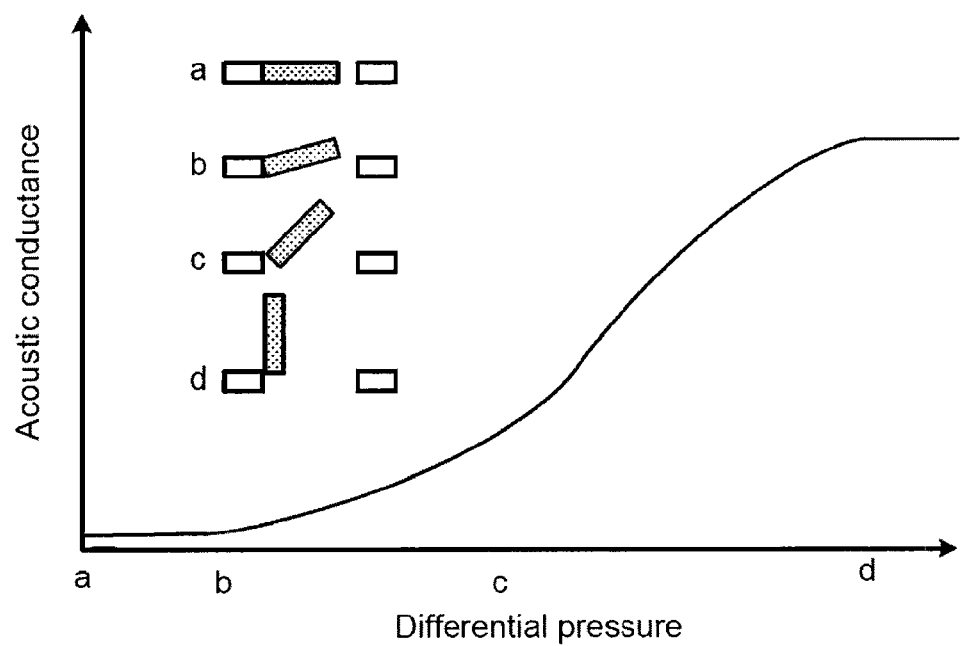
FIG. 5 illustrates a plot of acoustic conductance against differential pressure and the degree of opening of the vent structure.

The moveable portion may thus adopt a range of positions. These positions depend on the pressure differential acting on the moveable portion (or the variable vent). The extent to which the moveable portion is deflected also determines how much the moveable portion blocks/exposes the hole through the membrane and thus the size of the flow path, as illustrated in FIG. 5. FIG. 5 illustrates a graph of acoustic conductance against differential pressure. The acoustic conductance represents how readily air may flow between the two volumes and thus is related to the extent of opening of the flow path, i.e. the extent to which the hole through the membrane is exposed, against pressure differential.

FIG. 5 also illustrates the relative position of the moveable portion at four particular pressure differentials, indicated a, b, c and d. At low pressure differentials/equilibrium the moveable portion lies within the surface of the membrane and thus the flow path is substantially closed, as indicated by position a—with only the size of the channels defining the moveable portion providing a flow path. Thus the acoustic conductance is low, or substantially zero if the channels defining the moveable portion are thin enough.

At slightly higher pressure differentials the moveable portion may be slightly deflected but still lies at least partly within the planes defined by the upper and lower surfaces of the membrane. Thus the flow path remains substantially closed. Position b illustrates the position where the moveable portion is deflected upwards and the bottom part of the moveable portion is just about extending beyond the top surface of the membrane. Thus the acoustic conductance is still very low.

At higher pressure differentials the moveable portion is deflected so that at least part of the moveable portion extends completely beyond the membrane surface. This provides a certain size of flow path—however the hole is still partially blocked by the moveable portion. This is represented by position c.

As the amount of deflection increases the area of unblocked flow path increases until, at position d, the moveable portion is moved completely out of the area of the flow path and the vent is fully open with a defined maximum area. Even if the pressure differential increases further the size of the flow path will not increase any further. In practice however in some embodiments, the moveable portion may not be deformable to the full extent shown in position d.

It will be appreciated that the acoustic conductance (or acoustic impedance), i.e. the size of the flow path, does not exhibit a linear relationship with differential pressure. Thus the rate of flow will vary depending on how open the variable vent is. Until the moveable portion is deformed to the full extent, the rate of flow will increase more than linearly with applied differential pressure. Also pressure in any receiving volume due to an incoming step in applied pressure on the other side of the membrane will show a rise time depending on a time constant related to the acoustic capacitance of the receiving volume and the acoustic conductance of the vent, so the rise time will also decrease with increasing pressure steps, tending to reduce the peak pressure difference across the membrane and hence its deformation or stress.

In practice the acoustic pressure relating to even very loud sounds will be at least a couple of orders of magnitude below the pressure levels that the a microphone needs to withstand in accidental fault or overload conditions described. Thus for normal acoustic pressure levels, the vent structure will be operating well below pressure b, so will have negligible effect on e.g. the low-frequency roll-off.

Conveniently the variable vent is arranged so that the vent remains substantially closed (e.g. somewhere between positions a and b for the example shown with a moveable flap) during the pressure differentials expected in normal operation of the transducer and only starts to open significantly (i.e. extend beyond position b) when the pressure differential reaches unusually high levels or starts to approach levels that may potential cause damage to the transducer. It will be appreciated that having a flow path through the membrane could alter the operating characteristics of the transducer. As discussed above in relation to FIG. 1 in a MEMS microphone there may be one or more bleed holes though the membrane to reduce the impact of low frequency effects. The number and dimensions of these holes are carefully chosen to provide a desired operating characteristic. These bleed holes thus already provide a path for equalising the pressures in the two volumes on either side of the membrane, but these holes are deliberately designed such that such equalisation takes a long time in acoustic terms. Thus the bleed holes alone do not prevent large pressure differentials from causing damage to the transducer. The variable vents are provided to enable more rapid equalisation. However were the variable vents to be open to provide a significant flow path at the expected normal operating pressure differentials such additional flow paths would alter the frequency characteristics of the transducer and could result in distortion.

Thus the moveable portion of the variable vent may be configured such that there is substantially no movement of the moveable portion from the equilibrium position at pressure differentials below a first threshold. In particular the moveable portion may be deflected by less than the width of the membrane so that the trailing surface of the moveable portion (i.e. the surface on the opposite side to the direction of deflection) does not substantially extend beyond the membrane surface. Thus the flow path, i.e. hole through the membrane, remains largely blocked by the moveable portion. For acoustic transducers and the like the first threshold may by greater than 150 Pa and may be greater than 200 Pa or higher and could, in some applications be greater than 1 kPa. In other words the variable vent may remain substantially closed at pressure differentials up to about 150 Pa-200 Pa or higher. Thus the variable vent may provide substantially no significant variation in flow path size for pressure differentials in the range of 0 Pa-200 Pa. This means that the variable vent has minimal performance impact on the operation of the transducer.

The variable vent is arranged to open to provide a flow path at pressure differentials which approach the pressure differentials that may cause damage to the transducer. For instance the variable vent may be arranged to be open enough to provide a significant flow path for venting at a pressure differential of around 100 kPa. Thus the moveable portion may be configured such that there is substantial movement of the moveable portion from the equilibrium position at pressure differentials above a second threshold and the second threshold may be lower than 100 kPa. Thus the variable vent provides substantially a significant increase in flow path size for pressure differentials in the range of 100 kPa-200 kPa, compared to the flow path at equilibrium.

The pressure differential at which the variable vent will open will depend on various factors such as the thickness and composition of the material forming the moveable portion, e.g. the membrane and also (for a flap arrangement) the width of the connecting portion 404 compared to the area of the flap portion 402. For a MEMS microphone transducer with a membrane formed from silicon nitride, the membrane being of the order of 0.4 μm thick, suitable variable vents may be formed by etching a suitable shape and size of moveable flap portion as described above. For example the design shown in FIG. 4a was simulated with a flap portion radius of 12 μm and a connecting portion width of 6 μm. The results indicated that the variable vent will remain substantially closed at pressure differentials of up to between 1 kPa and 5 kPa. At between 20 kPa-50 KPa the vent is partially open and at 100 kPa the vent is open enough (i.e. such as illustrated in FIG. 4b) to provide a significant flow path.

Such a vent, when open, provides a significant flow path between the first and second volumes and thus significantly increases the rate at which pressure equalisation between the first and second volumes occur. This reduces the time for which the membrane may be exposed to a high stress. In addition however the variable vent can reduce the maximum or peak pressure differential experienced by the membrane.

To explain, imagine a high pressure impulse caused by trapped air being forced into a sound port due to the host device falling onto a surface. The pressure in the sound port will increase over a certain rise time, i.e. the pressure profile in the sound port will have a certain rise time. Now consider two examples. In the first example such an impulse is experienced by a conventional MEMS microphone and in the second example the pressure impulse is incident on an embodiment according to the present invention.

In the first example with the conventional microphone the increased air pressure in the sound port, and hence one of the volumes (say the first volume) will increase the flow rate through the bleed holes in the membrane but the size of the bleed holes is fixed. Thus a certain peak pressure differential will be reached which could potentially be of the order of 800 kPa or more. In the second example, with an embodiment of a MEMS transducer according to the present invention, as the pressure differential increases to high levels, e.g. 50 kPa or so, the variable vent may start to open thus providing some additional venting (in addition to the bleed holes) from the first volume, thus raising the pressure of the second volume towards the same level (and possibly reducing the pressure in the first volume compared to what it may have been). As the pressure in the sound port increases further, say to 100 kPa, the variable vent will be open providing a significant flow path thus providing much quicker equalisation. Depending on the nature of the pressure impulse the venting may reduce the peak pressure experienced in the first volume compared to the first example but in any case the pressure in the second volume will have a faster rise time, thus reducing the peak pressure differential experienced.

Figure 6A:
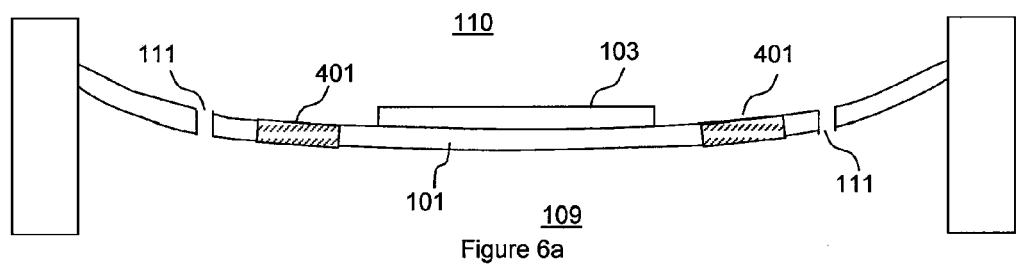
FIGS. 6a and 6b illustrate the membrane of a transducer having a variable vent.

FIG. 6 illustrates the operation of the variable vent. FIG. 6a illustrates the flexible membrane 101 of a transducer (the rest of the transducer structure being omitted for clarity). The membrane is supported between a first volume and a second volume. In this example the first volume includes the cavity 109 between the membrane and substrate. The first volume may additionally or alternatively comprise a cavity in the substrate. The second volume may include the second cavity 110 between the membrane and back-plate. The second volume may also comprise an area outside of the back-plate which experiences effectively the same pressure variations as the second cavity.

The membrane has a plurality of bleed holes 111 which are dimensioned and arranged to produce a tuned effect on the transducer and reduce the impact of low frequency pressure variations. The membrane is also provided with a plurality of variable vent structures 401 as described above. In some applications it may be possible to use a single variable vent structure but in some applications it may be beneficial to provide the membrane with a plurality of variable vent structures. Where there are a plurality of variable vent structures they may be distributed relatively evenly around the membrane.

FIG. 6a shows the variable vent structures being located on the membrane outside of the area of the membrane electrode 103. This means that the vent is formed just of the materials of the one or more layers forming the membrane 101. However in some embodiments it would be possible to form the variable vent structure within the area of the electrode, for instance in exclusion areas within the overall area of the electrode where no metal electrode is deposited. Alternatively the variable vent structure could be formed in the area of the electrode with the membrane and electrode layers together forming the variable vent structure. In some applications forming the moveable portion of the vent from the membrane layer and metal layer may provide a stronger moveable portion. It should be noted that wherever the variable vent structure is formed there may be one or more additional materials coupled to the membrane at that location so as to tailor the properties of the variable vent, for example the flexibility or stress handling capability.

FIG. 6a illustrates the situation in normal operation where the pressure in the second volume 110 is greater than the pressure in the first volume. The membrane is thus deflected downwards from the membrane equilibrium position. However the pressure differential is within the normal expected operating range of the device, i.e. below an operating threshold, and thus the variable vents 401 remain substantially closed.

Figure 6B:
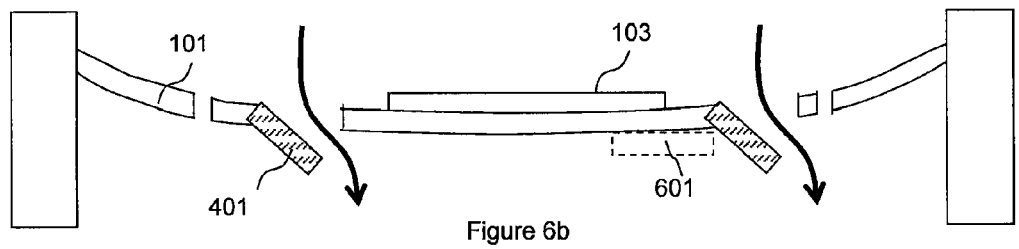

FIG. 6b shows the situation where the pressure differential has increased beyond a threshold to a level sufficient to causes the variable vents to open. The moveable portions of the membrane, which in this example are moveable flap portions, are thus deflected downwards thus opening up flow paths, i.e.

holes, through the membrane which more allows more rapid equalisation with the benefits discussed above.

The material of the membrane 101 is relatively resilient. Thus if the pressure in the second cavity stops increasing then, after a short time, the venting through the variable vents 401 will reduce the pressure differential to a level at which the variable vents return to the closed position shown in FIG. 6a. If the pressure in the second cavity were then to reduce relatively quickly the pressure differential across the membrane in the opposite direction may increase, such that the membrane is deflected upwards. The pressure differential may increase to such an extent that the vents now open in the upward direction to vent air from the first volume into the second volume. It will thus be appreciated that the variable vents may be bi-directional and allow venting from the first volume to the second volume and vice versa.

It will be seen from FIG. 6b that when the variable vent is open the moveable flap portion will be deformed away from the surface of the membrane—in the same direction that the membrane is deflected. Thus the moveable flap portion could potential extend further than the membrane itself. In some embodiments the membrane may be arranged relative to the rest of the transducer structure, such as the back-plate or some structure of the substrate, such that the membrane may make contact with the transducer structure (illustrated as 601 in FIG. 6b). In some instances this may be beneficial in preventing too much travel of the membrane. Clearly the variable vents need to be able to open to provide the advantages described above and thus the variable vents are preferably arranged with regard to the transducer structure so that the transducer structure will not prevent the vents from opening. Also it may be preferred that there is no structure immediately within outlet path for the vent when open. In some instance the vents may be arranged on a part of the membrane such that the vents will not come into contact with the transducer structure. For example with regard to the back-plate the vents may be arranged so that the moveable portions open into an area of one or more of the back-plate acoustic holes. In other embodiments however the vents may be arranged such that they can open sufficiently to provide a significant flow path but are prevented from opening any further by the transducer structure. Thus the transducer structure may act as a hard stop for the moveable portion of the vent which may reduce or limit the stress in the moveable portion and help prevent damage to the moveable portion.

Figure 7:
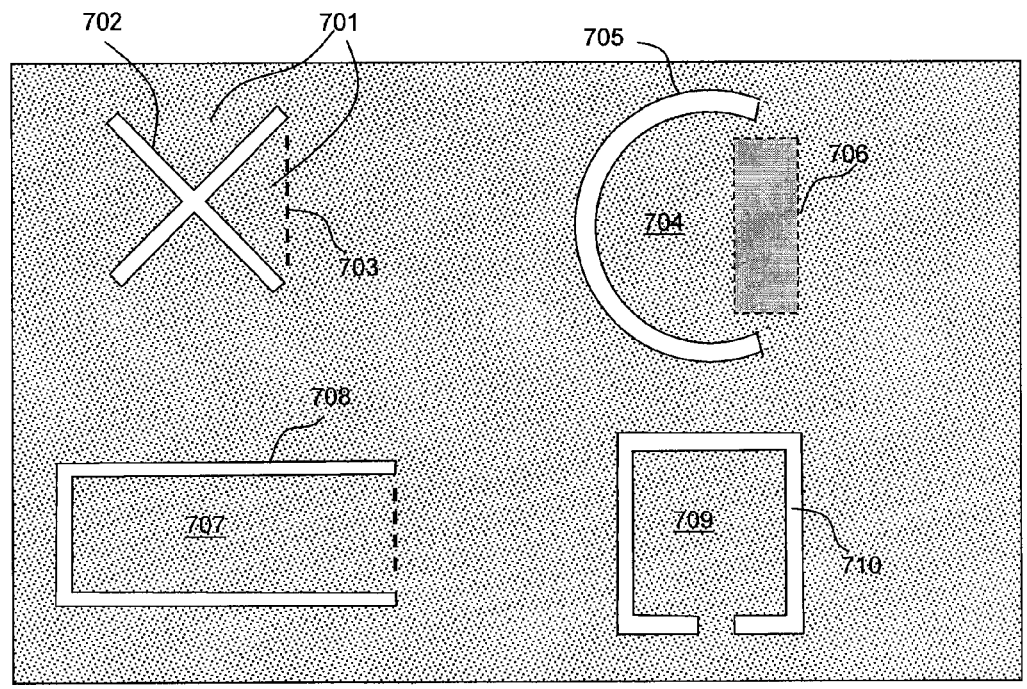
FIG. 7 illustrates other embodiments suitable variable vent structures.

The moveable portion of the variable vent may take many forms. FIG. 7 illustrates a variety of different configurations of suitable variable vent structure. In the top left a number of interconnecting channels 702 are etched to leave a number of moveable flap portions 701. In this example the channels are etched as a cross shape to define four triangular moveable flap portions. This configuration provides a relatively wide connecting portion, indicated by dotted line 703, compared to the surface area of the flap portion. Such a configuration may be relatively strong.

It will be appreciated that when subjected to a pressure differential which is sufficient to cause the moveable flap portion to deform there will be significant stress on the connecting portion. It is desirable for the variable vent to be able to survive high pressure differential without damage, thus a wide connecting portion may be preferred in some applications. It is noted however the action of the vent opening will result in the effective area of the moveable flap portion exposed to the higher pressure area being reduced. Thus, for a fixed pressure differential, the force on the moveable flap portion will reduce as the vent opens which helps prevent the moveable flap portion from deforming too far.

In some instance however the variable vent structure may comprises material which is provided specifically to ensure desirable properties of the vent structure. For instance FIG. 7 also shows a generally curved, e.g. semi-circular, moveable flap portion 704 formed by channel 705 with a layer of strengthening material 706 provided in the vicinity of the connecting region. The strengthening material could for instance comprise a metal and may for instance be formed of the same material used to form the membrane electrode although other materials may of course be used.

FIG. 7 also shows a rectangular moveable flap portion 707 formed by a channel 708 around three sides only and a generally square flap portion 709 formed by channel 710 and having a relatively narrow connecting portion. In general the moveable flap portion of the membrane is defined by one or more channels running through the membrane and the flap portions may be, for example, one of triangular, circular, elliptical or rectangular in shape or generally have the shape of any suitable regular or irregular polygon.

Figure 8A:
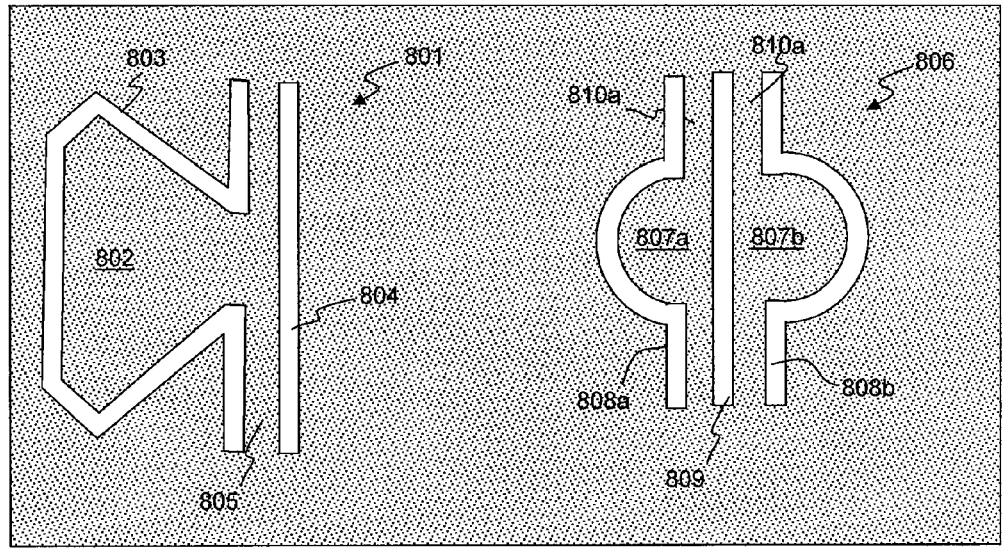
FIGS. 8a to 8f illustrate further suitable vent structures.
Figure 8B:
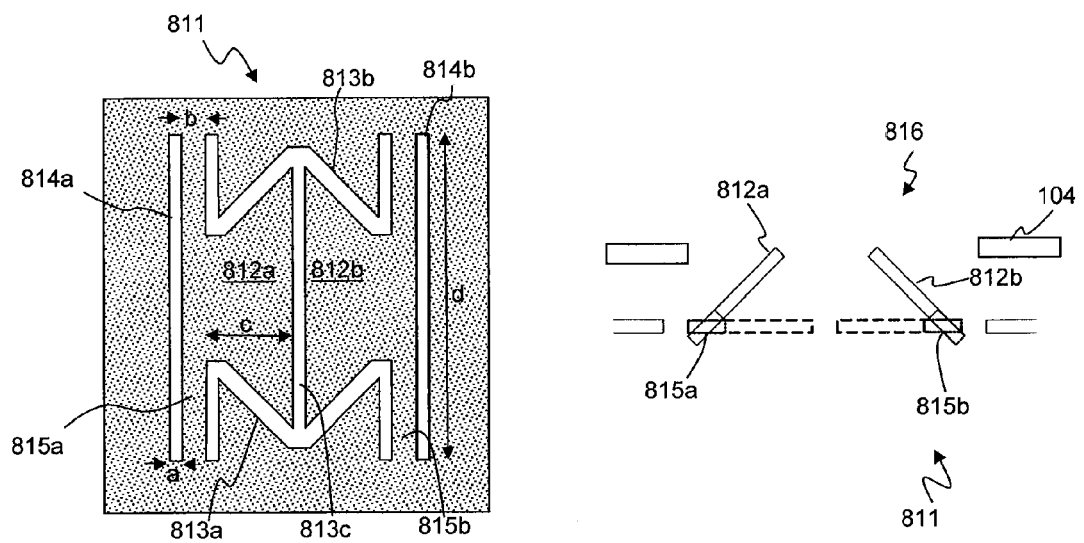

FIGS. 8a and 8b shows some further examples of suitable moveable portions. FIG. 8a shows a variable vent structure 801 comprising a moveable portion 802 which comprises an irregular polygon shape defined by channel 803. In this embodiment however the channel 803, together with additional channel 804 mean that the moveable portion 802 is connected to the rest of the membrane by a beam structure 805. The beam 805 connects to the rest of the membrane at both ends and supports the moveable portion 802. As with the embodiments described previously a pressure differential acting on the membrane, and hence the moveable portion 802, tends to deflect the moveable portion 802 out of the plane of the membrane. In this embodiment however deflection occurs due to a twisting of the beam 805, rather than an out of plane bend of the connecting portion. The beam 805 thus acts as a torsional beam. The stress and deflection of moveable portion achievable is controllable via the dimensions of the torsion beam 805. This can allow the same degree of deflection as the embodiments discussed previously but with lower stress and hence less likelihood of damage—or alternatively allow a greater degree of opening for a given pressure differential.

FIG. 8a also shows a further variable vent structure 806 comprising two semicircular moveable portions 807a and 807b defined by channels 808a and 808b and also channel 809, connected to the membrane by torsional beams 810a and 810b. Again movement of the moveable portions 807a and 807b involves twisting of the beams 810a and 810b.

FIG. 8b shows a further variable vent structure 811 in plan view and also in sectional view when at least partly open. The variable vent structure 811 comprises two moveable portions 812a and 812b, which in this example have generally trapezoidal shapes defined by channels 813a and 813b (including common central channel 813c), with channels 814a and 814b defining torsional beams 815a and 815b supporting the moveable portions.

Again the properties of the vent in terms of the pressure differential at which the vent opens and the stresses on the vent structure can be controlled by appropriate choice of dimensions, as can the open-to-closed ratio of the vent. In one example, where the vent is formed in a silicon nitride membrane of the order of 0.4 μm thick, the width of channels defining the vent structure, i.e. dimension 'a' in FIG. 8b, may be of the order of 1 μm. The width of the beam structure, dimension 'b' may be of the order of 3 μm. The moveable portion 812a and 812b may each be about 15 μm wide, i.e. dimension 'c' of the width of the moveable portion from central channel 813c to the beam structure. The length of the beams, dimension 'd' may be of the order of 30 μm.

It will be noted that the overall shape of the flow path of the vent structure shown in FIG. 8*b* is defined by the two moveable portions 812*a* and 812*b* and is generally hexagonal. This may be a particular advantageous shape for the vent.

As mentioned previously the vent structure may be arranged with respect to the other structure of the transducer, such as the back-plate 104, so that the vent is aligned with a gap in the back-plate to allow the vent to open to a desired extent. Thus, as described the vent may be aligned with acoustic holes in the back-plate 104. In some embodiments however the size of the acoustic holes typically provided in the back-plate may be smaller than the size of the vent. Thus in some embodiments the structure of the back-plate 104 is provided with larger holes 816 or gaps in the vicinity of the vent structures.

The back-plate 104 is typically designed to be relatively acoustically transparent and thus providing additional holes in the vicinity of the vents is acceptable. Nevertheless changing the size and/or distribution of the holes through the back-plate may have an impact on the acoustic properties of the device, for instance the low-frequency roll-off of a microphone. The provision of holes in the back-plate to allow the vents to open may therefore be compensated by a reduction in the size and/or spacing of the acoustic holes 112 to maintained desired properties and/or the holes in the back-plate may be closely matched to the shape of the vents.

Figure 8C:
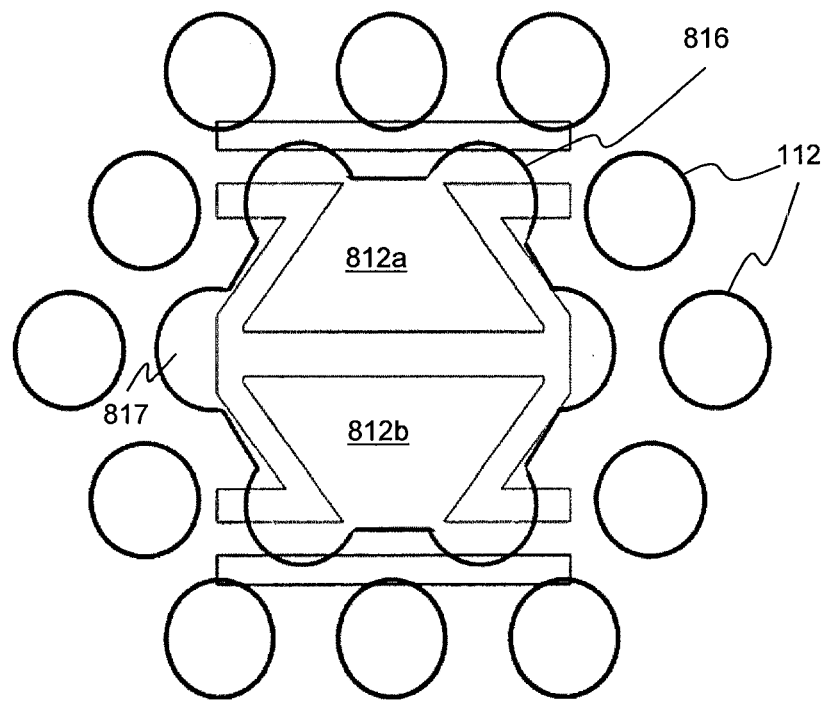
Figure 8D:
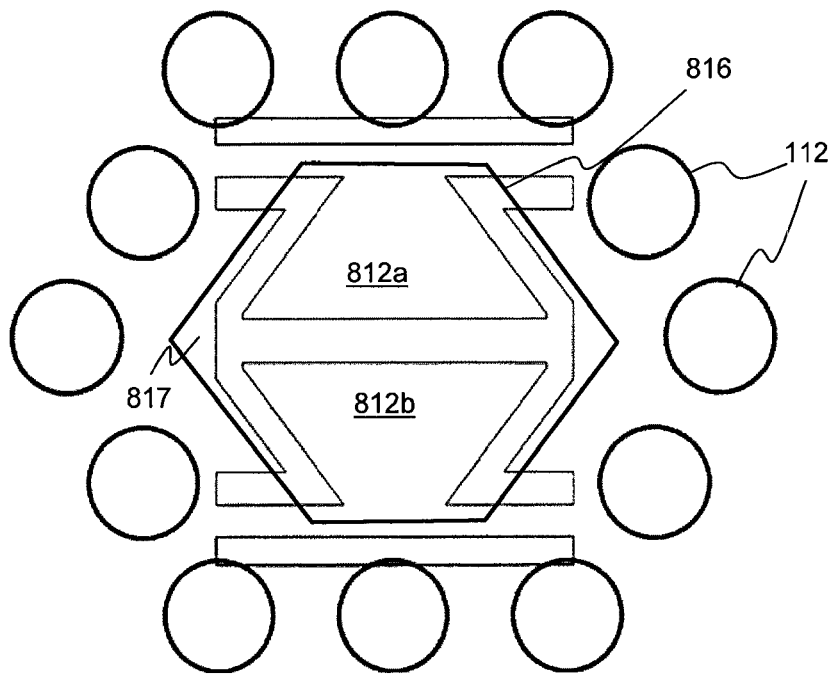

FIGS. 8*c* and 8*d* illustrate the arrangement of holes through the back-plate in two embodiments for a variable vent of the form shown in FIG. 8*b*. FIGS. 8*c* and 8*d* show a plan view of a part of the back-plate and illustrates a regular array of acoustic holes 112, which in this example are arranged in a regular hexagonal pattern. Also shown is the structure of an underlying variable vent in the membrane and the moveable portions 812*a* and 812*b*. It can be seen the moveable portions are larger than the size of the acoustic holes 112. For example the acoustic holes could be of the order of 10 μm in diameter, with each acoustic hole separated from its nearest neighbour by about 5 μm. In the example described above the width of each of the two moveable portions was of the order of 15 μm.

Thus, in this embodiment, in the vicinity of the vent there is a larger vent hole 816 in the back-plate 104 to allow space for the moveable portions 812*a* and 812*b* to open. The vent hole 816 provided in the back-plate may be sized and shaped to match the vent shape. FIG. 8*c* shows an arrangement where the vent hole 816 corresponds to overlaying the acoustic hole pattern in the vicinity of the vent with a pattern corresponding to the vent. FIG. 8*d* shows an alternative arrangement wherein the acoustic holes pattern is omitted in the vicinity of the vent and instead a vent hole 816 corresponding to the shape of the vent structure is provided.

As illustrated the vent hole in the back-plate may be at least the size of the variable vent and may be generally the same shape, although it will be appreciated that in some embodiments different shapes could be used and the moveable portion of the vent may only require a smaller opening in the back-plate to accommodate the necessary range of movement of the moveable portion.

It will also be seen that in this embodiment the general shape of the vent structure matches the arrangement of the acoustic holes with the result that the larger vent holes 816 can be readily accommodated in the normal pattern of the acoustic holes.

In the embodiment shown in 8*c*, the vent hole 816 in the back-plate includes an area 817 which is positioned near where the variable vent will first open but which is laterally offset from the area of the vent, i.e. which doesn't overlap with the area opened in the membrane when the vent opens. Such an arrangement can be advantageous in maximising the amount of venting through the variable vent at positions where the moveable portions 812*a* or 812*b* have not been fully deflected. In other words providing such an area of back-plate hole which is near to the position where the vent opens, but which is slightly offset from the position of the vent, can aid in maximising the amount of venting as the vent is opening and thus ensure that significant venting occurs as soon as possible when a pressure differential sufficient to cause the vent to open exists.

Referring back to FIG. 8*b* it can be seen that as the moveable flap portions 812*a* and 812*b* deflect, so as to provide a flow path through the membrane, the size of the flow path in a direction normal to the membrane is effectively defined by the gap opened between the moveable portions 812*a* and 812*b*. Thus air passing through the vent may be effectively funnelled through this gap by the moveable flap portions 812*a* and 812*b*. It will be appreciated however that the size of such a gap may remain relatively small until the moveable portions 812*a* and 812*b* have been deflected to a reasonably significant degree. For example consider that the moveable portions each have the same width (i.e. dimension "c" in FIG. 8*b*) so that if both moveable portions were deflected to be normal to the membrane (assuming this would be possible) then the gap would be have a maximum value G. If the moveable portions were each deflected to lie at an angle of about 45° to the membrane then the gap would be of the order of about 0.3G (neglecting any deformation of the shape of the moveable portion).

As the moveable portion deflects away from the membrane it may also be possible for air to pass through the exposed path through the membrane and then deflect laterally, i.e. in the example shown in the sectional view of FIG. 8*b* air in the region between moveable portion 812*a* and the plane of the membrane (i.e. between the moveable portion 812*a* and its illustrated quiescent position) may vent in a direction into or out of the page as illustrated.

Whilst this side venting will occur in practice, in the situation where the moveable portion is being deflected into the cavity between the membrane and back-plate it has been found that having the vent hole in the back-plate (which corresponds to the variable vent) extend to an area where such side venting may occur can be advantageous to increase the amount of such venting.

Figure 8E:
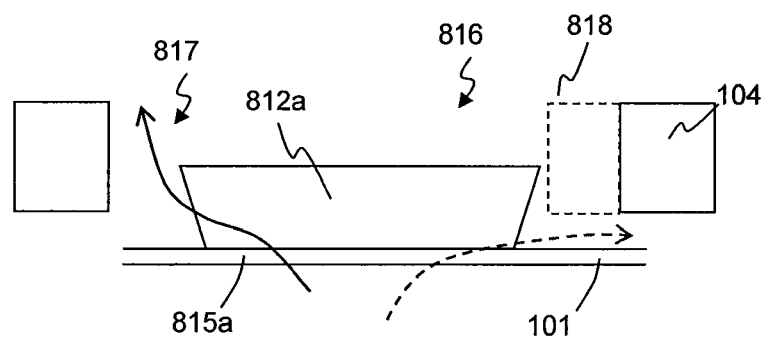

FIG. 8*e* illustrates the situation where a vent having the structure shown generally in FIG. 8*b* is partially open when the membrane 101 has been deflected towards back-plate 104. It will be appreciated that the back-plate 104 may have a thickness of the order of a few microns or more. FIG. 8*e* shows a view looking side on compared with the view shown in FIG. 8*b* and shows moveable flap portion 812*a* in a partially deflected position away from membrane 101, towards back-plate 104. As mentioned the vent hole 816 in the back-plate may be dimensioned to at least correspond to the size of the variable vent to allow the vent to open in the area of vent hole 816. In the embodiment shown in FIG. 8*e* the vent hole 816 in the back-plate has area 817 which extends laterally away from the area of the vent at a position where the vent first opens. This allows a flow path through the vent illustrated by the solid arrow which passes through the plane of the membrane but then vents out the side of the partially open vent. The dotted area 818 illustrates what would happen in the absence of such lateral area 817 of back-plate hole. Some air could still possibly vent from the side of the partially open vent into the cavity between the membrane and back-plate, if the membrane 101 were not in contact with the back-plate 104 as illustrated by the dashed arrow. The degree to which side venting could occur may however be much reduced without the lateral area 817.

In various embodiments therefore for at least some vent holes in the back-plate which are provided in the location of a variable vent, for example to allow space for the variable vent to open into the area of the vent hole within the back-plate, the area of such a back-plate vent hole may extend laterally away from the area of opening of the vent, at a position at or near where the vent first opens, in order to allow or improve side venting.

As mentioned above the use of torsional beams such as illustrated in the embodiments of FIGS. 8a and 8b above can be advantageous in allowing the moveable flap portion of the variable vent to move to open the vent whilst limiting the stress within the structure. One factor that impacts on the degree of movement of the moveable portion of the variable vent and its related stress is the length of the torsional beam, i.e. dimension d in FIG. 8b. Longer beam lengths allow a greater degree of movement for a given stress level or reduces the overall stress for a given degree of movement. It may therefore be desirable in some embodiments to provide beams of relatively long length.

It will be noted however that use of a variable vent structure in the membrane including a torsional beam involves channels being formed in the membrane to define the torsional beam. For instance in FIG. 8b channels 814a and 814b are required to partly define the torsional beams 815a and 815b. These channels do not form part of the variable flow path part of the vent, i.e. such channels do not form part of the variable flow path which is opened by movement of the moveable portion(s) of the vent. In order to minimise the effect of the vent structure when the vent is closed it can be beneficial to limit the extent to which such channels are located in the same position as an acoustic hole in the back-plate. If a channel through the membrane is located at the same position as a hole in the back-plate this can provide a small flow path even when the vent is closed. For channels in the membrane which are used to define the moveable portion of the vent structure, such as channel 813c, it may be inevitable that such channels will correspond to a hole in the back-plate. Such channels will effectively form part of the vent flow path when open and thus may be provided in a location that corresponds to the larger back-plate hole 816. However it can be beneficial to configure any channels which do not correspond to the variable flow path of the vent structure so as to minimise the extent to which they overlap with any back-plate holes, i.e. underlie (or overlie depending on the transducer structure) any acoustic holes in the back-plate.

In some embodiments therefore the pattern of back-plate holes, i.e. acoustic holes 112, may be arranged such that one or more areas of the back-plate that correspond to the location of channels in the membrane that define part of the variable vent structure are substantially devoid of any back-plate holes.

In other words there may be at least one vent hole in the back-plate that corresponds to the flow path of the variable vent, i.e. large hole 816, and which may be sized to allow the vent to at least partly open in such a hole. Such a vent hole in the back-plate may be sized and shaped to generally correspond to the flow path enabled by the variable vent when open—with possible lateral areas at the location where the vent first opens to allow early side venting. However the vent hole may be arranged so as to not substantially extend over any channels in the membrane used to define part of the variable vent structure in the membrane that do not form part of the variable flow path in use. Referring to FIG. 8d the hole 816 is arranged so that it does not extend as far of the upper and lower channels used to define the outer edges of the torsional beams. The pattern of other holes in the back-plate, i.e. acoustic holes 112 may then be arranged so as also not to substantially overlap with any channels of the vent structure, i.e. to define areas where the channels in the membrane may be provided.

In some embodiments however it may be desirable to have a regular pattern of acoustic holes without any area significant devoid of acoustic holes in the back-plate. Such a pattern of acoustic holes may therefore limit the maximum length of the channels that can be created to define the torsion beam structure without significant overlapping with acoustic holes. For instance, consider the arrangement illustrated in FIG. 8d where the acoustic holes 112 in the back-plate are arranged as a hexagonal packed array and the variable vent has a generally hexagonal shape. If the acoustic holes 112 are say of the order of 10 µm in diameter and separated from one another by 5 µm then the maximum gap between adjacent 'rows' of acoustic holes is less than 3 µm. As discussed above, in one example the beam may be of the order of 3 µm wide with the channels defining the beams being 1 µm wide. It can then be seen therefore that in such an arrangement it may not be possible to extend the length of the torsional beam beyond a certain length, in this example of the order of about 30 µm, without at least one of the channels that defines the torsional beam overlapping with an acoustic hole in the back-plate or without having to omit some of the acoustic holes 112 from the array with a consequent possible impact on performance.

Figure 8F:
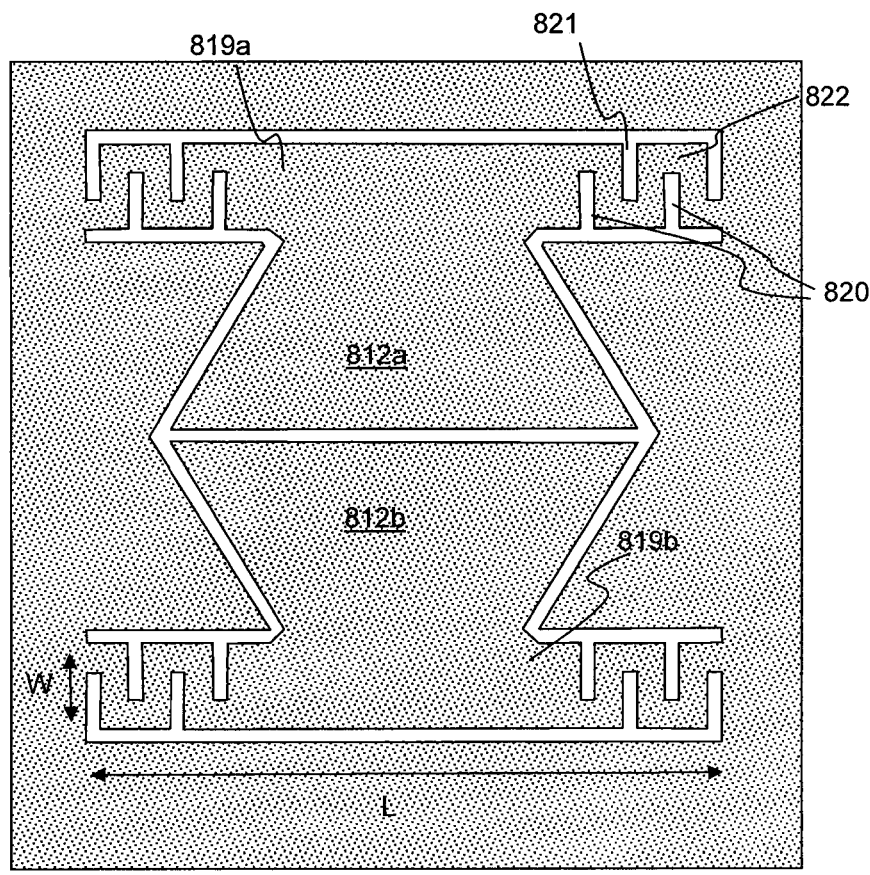

In some embodiments therefore a beam structure connecting a moveable portion to the rest of the membrane may have a non-rectilinear path. In other words the path created by the beam connecting the moveable portion to the rest of the membrane may have one or more bends in it within the plane of the beam. This can increase the effective path length of beam that can be provided within a given distance. For example the beam may have a serpentine or meandering structure as illustrated in FIG. 8f. In the example illustrated in FIG. 8f channels are formed in the membrane to form two moveable portions 812a and 812b as described above with relation to FIG. 8b. These moveable portions are connected to the rest of the membrane via beam structures 819a and 819b. In this embodiment however the channels defining the beam structures 819a and 819b have sections 820 and 821 extending transversely with respect to the overall beam length to define serpentine sections 822 of the beam structure. These serpentine sections 822 act as spring sections and increase the effective length of the beam structure. The effective length of the beam structure is equal to the overall length of the beam structure L plus the width W of the spring structure for each bend. Thus the beams 819a and 819b illustrated in FIG. 8f have an effective length of L+6 W. Using such a spring structure to increase the effective length of the beam structure has the advantages described above, of allowing a greater degree of movement for a given stress level/reducing the overall stress for a given degree of movement but without requiring the overall length of the beam structure to be increased.

In the embodiment of FIG. 8f the same spring structure is formed in each of the two arms of a beam structure connecting a moveable portion to the substrate. Such an arrangement may be beneficial in some material systems to ensure that the stresses induced by deflection of the moveable portion are evenly distributed—however this need not be the case and in other embodiment more bends in the beam structure may be present in one arm than the other.

FIG. 8f shows right angled bends in the beam path and generally square corners. It will be appreciated however that a range of other shapes are possible. For instance the bends in the beam path may be lower than 90° (or greater in some applications) and/or be more rounded, for instance to reduce stress.

As mentioned the serpentine type shape, i.e. tortuous path, provides a torsional spring structure and thus in general the moveable portions are connected to the rest of the membrane via one or more torsional springs. Using torsional springs in this way can reduce the pressure differential at which the variable vent opens whilst maintaining a low footprint of the vent structure (so that the channels forming the spring structure do not need to substantially overlap with any back-plate holes) and low stress properties.

A vent design with rectilinear torsion beams such as shown in FIG. 8b was produced and compared to a vent design incorporating a serpentine spring structure such as shown in FIG. 8f. The overall length L of the beam structures was the same in both cases and the size and shape of the moveable portions were the same. The deflection of the moveable portions of the vent including the torsional springs was significantly increased for a given pressure differential compared to the vent with straight torsional beams. In one test a pressure differential of 50 kPa led to a 12.3 µm deflection in a variable vent with the torsional springs compared to a deflection of 4.5 µm in the vent with a straight torsional beam. This results in a factor of 18 reduction in the air resistance of the vent at that pressure.

In general therefore in some embodiments the variable vent may comprise a moveable portion which is moveable to expose a flow path through a surface where the moveable portion is connected to the surface by at least one torsional spring. The torsional spring may comprise a beam defining a non rectilinear path. The surface may be the membrane and the moveable portion may a portion of membrane material which is moveable with respect to the rest of the membrane.

Figure 9A:
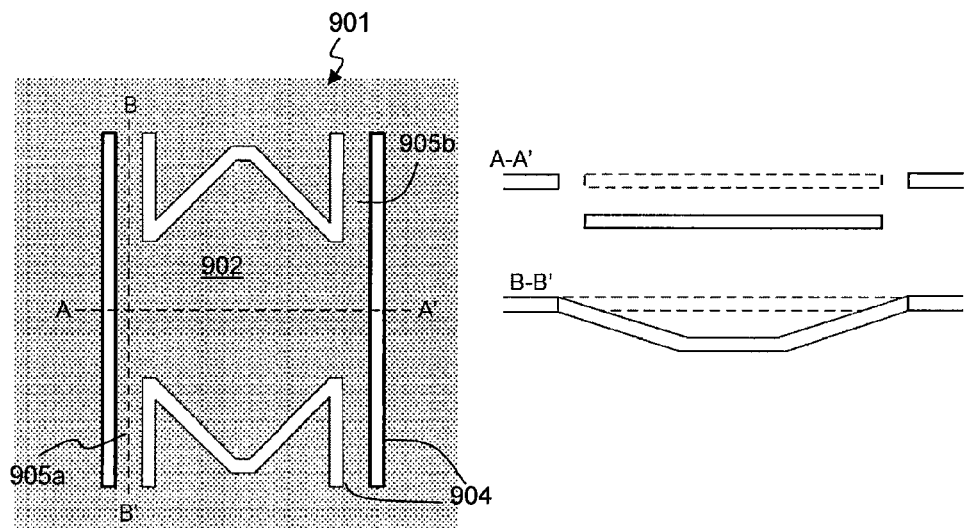
FIG. 9a-c illustrate further examples of suitable vent structures.
Figure 9B:
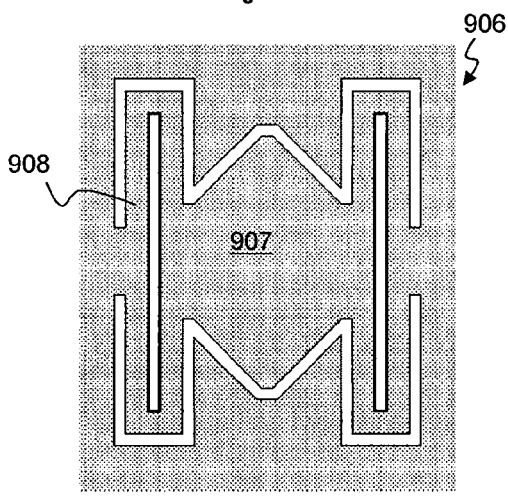
Figure 9C:
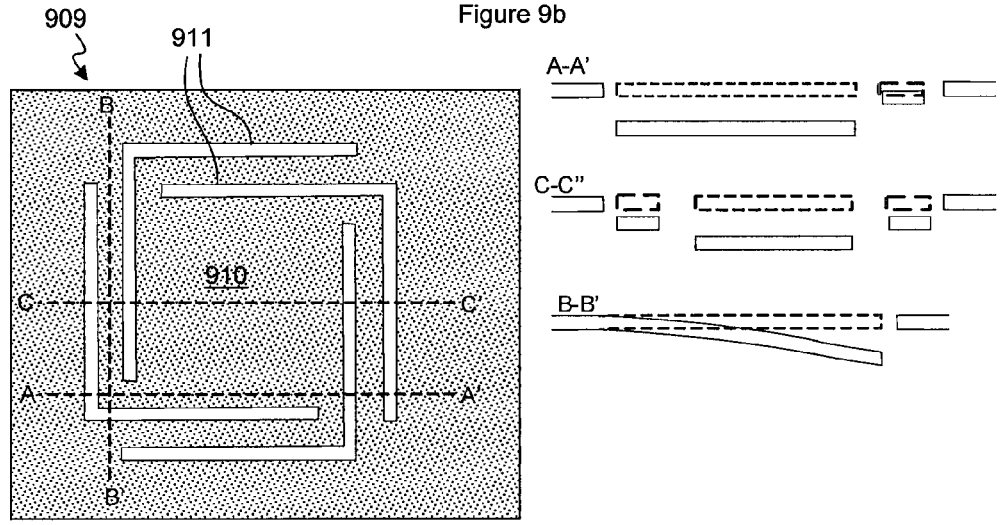

FIGS. 9a-9c show yet further examples of suitable variable vent structures. In these examples the variable vent structure comprises a moveable portion which is moveable out of the plane of the membrane to provide a flow path. FIG. 9a shows a first variable vent structure 901 which has a moveable portion 902 which is defined by channels 903. The channels 903 are arranged to define beam portions 905a and 905b that can bend in response to a pressure differential on the moveable portion 902 so that the moveable portion can be deflected out of the surface of the membrane, as illustrated in the sectional view in FIG. 9a.

FIG. 9b shows another vent structure 906 along similar lines having a moveable portion 907 connected to the rest of the surface by beams, but with additional channels so as to defining a serpentine beam structure 908 to provide a greater degree of bending.

FIG. 9c shows a further example of a variable vent structure 909 having a moveable portion 910 connected by a plurality of beams 911 which effectively acts as leaf springs supporting the moveable portion 910.

It will of course be appreciated that the shape of the moveable portion may vary and could for instance be circular or elliptical or generally in the shape of a regular or irregular polygon, with varying numbers of supporting arms or leaf springs which may or not have bends therein to describe a serpentine structure. In general then the moveable portion may be moveable in a direction which is generally normal to the plane of the membrane and supported by beam structures that may be straight or curved or formed as spring structures.

Figure 10A:
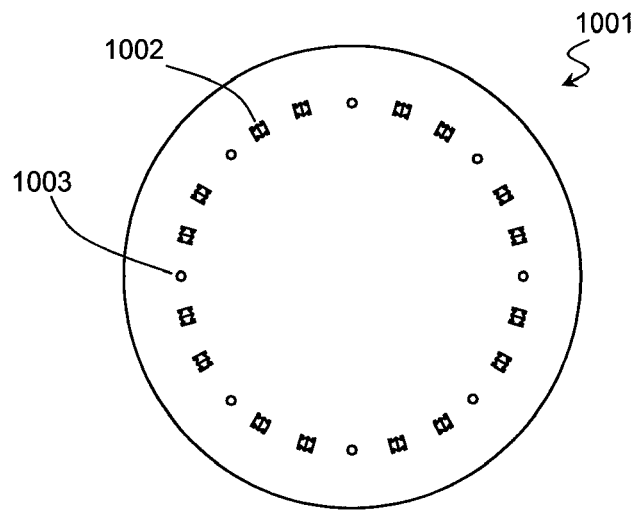
FIGS. 10a and 10b illustrates plan views of a membrane having a plurality of variable vent structures.

As discussed previously there may be more than one variable vent structure provided in the membrane and the variable vent structures may be evenly spaced around the membrane as shown in FIG. 10a which illustrates a plan view of the membrane 1001 of a transducer and which illustrates the spacing of variable vents structures 1002 and bleed holes 1003.

Figure 10B:
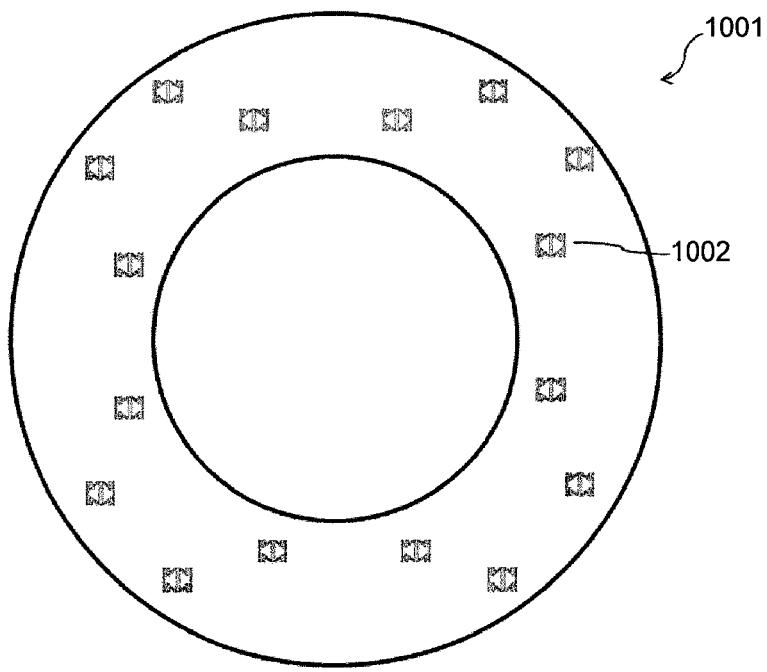

Alternatively the vents may be arranged in other patterns such as shown in FIG. 10b. FIG. 10b also shows the orientation of the vent structures 1002 may be the same in different locations, for instance to fit into the pattern of acoustic holes and larger back-plate holes as described previously.

As described above at least one variable vent may be formed in the membrane. Additionally or alternatively at least one variable vent may be formed with a flow-path that bypasses the membrane. For instance the flow-path may bypass the membrane and run through at least part of a side-wall of some transducer structure.

Figure 11:
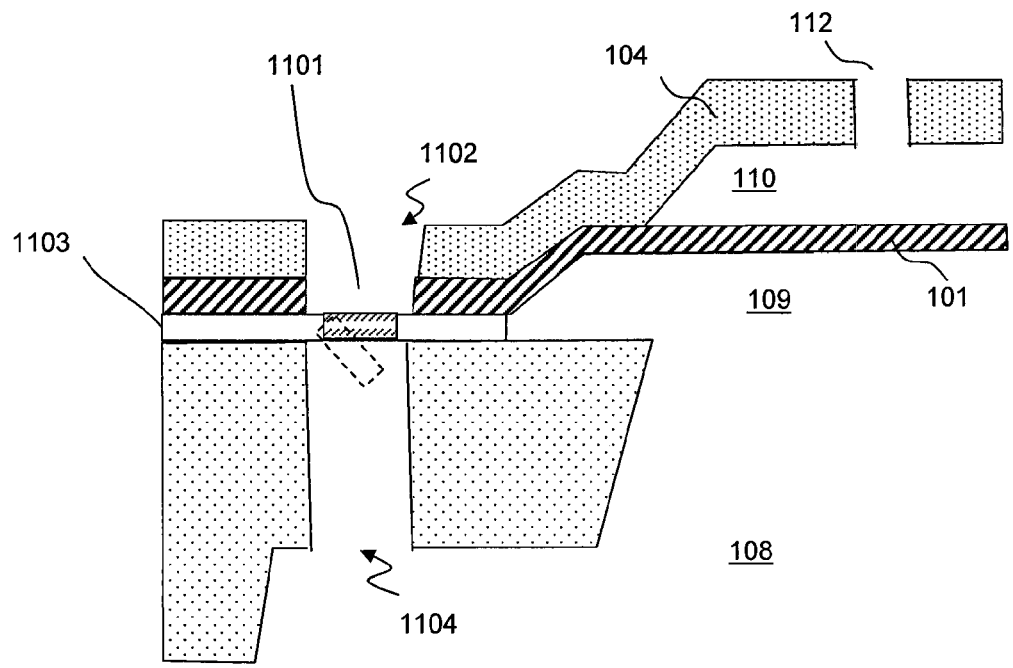
FIG. 11 illustrates a transducer with a variable vent in a flow path that by-passes the membrane.

FIG. 11 shows an embodiment having a flow path with a variable vent 1101 that bypasses the actual membrane. FIG. 11 shows part of the support structure of the transducer including at least a back-plate structure 104 and one or more membrane layers 101. In this example the side walls of back-plate structure 104 and membrane layer(s) 101 are patterned to provide a first port 1102 of a flow path. In this example port 1102 provides a flow path to a volume outside the first cavity 110. As the back-plate structure is relatively acoustically transparent however due to acoustic holes 112 the pressure in the first cavity is closely linked to the pressure in this area. Thus the port 1102 provides a flow path to/from a volume which includes the second cavity 110.

The substrate 105 is also etched to provide a port 1104 for a flow path to/from a volume comprising the first cavity 109 and substrate cavity 108.

Located in the flow path between ports 1102 and 1104 is a layer of material 1103 deposited on the substrate and formed to include a variable vent 1101. The variable vent may have the form of any of the vents described above (with the vent being formed in the layer 1103 rather than the membrane as described above). In this instance the material of the vent may chosen for desired properties without resulting in a change in the properties of the membrane. The thickness of the layer may also be controlled to provide desired vent characteristics. However material layer 1103 may be any material layer which is provided as part of the transducer structure and could itself be the same material as the membrane. Operation of the variable vent is as described previously. A pressure differential across the membrane with also lead to a similar pressure differential across the variable vent. At pressure differential encountered in normal operation the variable vent may be remained closed and thus the acoustic properties of the transducer depend on the membrane. If a high pressure differential is encountered the vent may open helping to equalise the two volumes and thus reduce the pressure differential on the membrane.

The embodiments discussed above have focussed on a flow path connecting the first volume to the second volume. Such an arrangement is advantageous as it increases the pressure in the low pressure volume as well as potentially reducing the pressure in the high pressure volume. However in some applications it may be possible to provide a variable vent that has a flow path from one of the first and/or second volumes to outside the first and/or second volumes. In other words rather than connect the first volume directly to the second volume, the flow path may be to some other volume. The other volume may be a locally enclosed volume, and may be contained in the transducer or its package or a device containing the transducer, or may be a volume not locally enclosed including even the outside atmosphere. In normal operation such a variable vent will remain closed but in response to a high pressure in the relevant volume the vent may open to provide venting from the high pressure volume to help reduce the absolute pressure. Alternatively for the volume which is not directly connected to or part of the sound port, e.g. a back-volume, the vent could open in response to high pressure in the outside atmosphere so that the pressure in the back-volume increase at the same time as the pressure in sound port is increasing the pressure in the other volume.

Figure 12A:
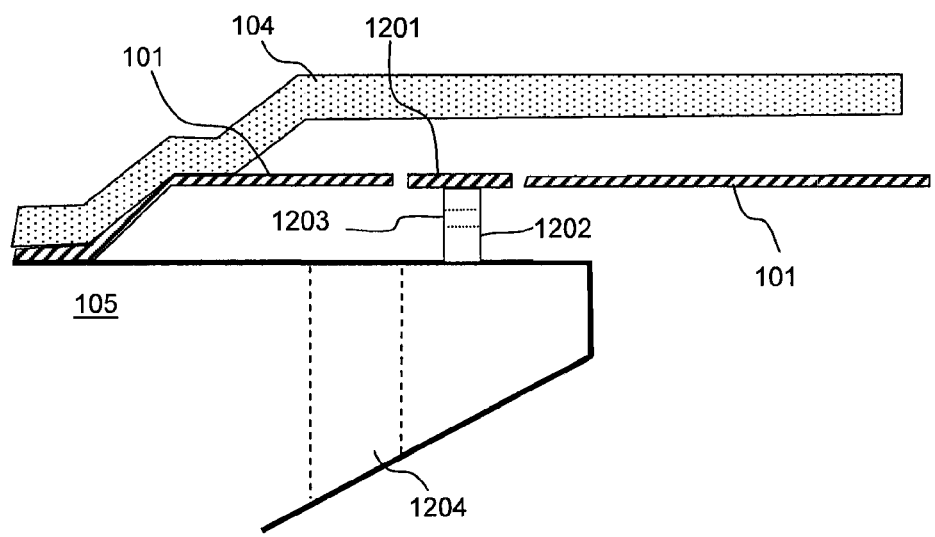
FIGS. 12a-c illustrate a further variable vent structure according to an embodiment of the invention.

FIG. 12 illustrates a further example of a variable vent according to an embodiment of the invention. FIG. 12a illustrates the membrane 101 suspended from substrate 105 and back-plate 104 as described previously. In this embodiment however there is a hole in the membrane 101 which, at equilibrium position, is substantially closed by a plug section 1201. The plug section 1201 is supported so as to be substantially fixed in position In other words the membrane 101 is moveable with respect to the plug section 1201 with the plug section being substantially fixed with respect to the membrane support structure, i.e. the substrate 105, back-plate 104 and/or side wall structures. In the example shown in FIG. 12a the plug section is supported from the substrate 101 in the area where the membrane overlies the substrate 105 by one or more support structures 1202 which may for example be support columns. The support structure keeps the plug section in position.

In use in equilibrium the plug section 1201 substantially blocks the holes in the membrane 101 and thus prevents a substantial flow of air as described previously. as the membrane deflects away from equilibrium position the plug remains in position and thus increasingly the hole through the membrane is exposed, providing an increased flow path as described previously.

Figure 12B:
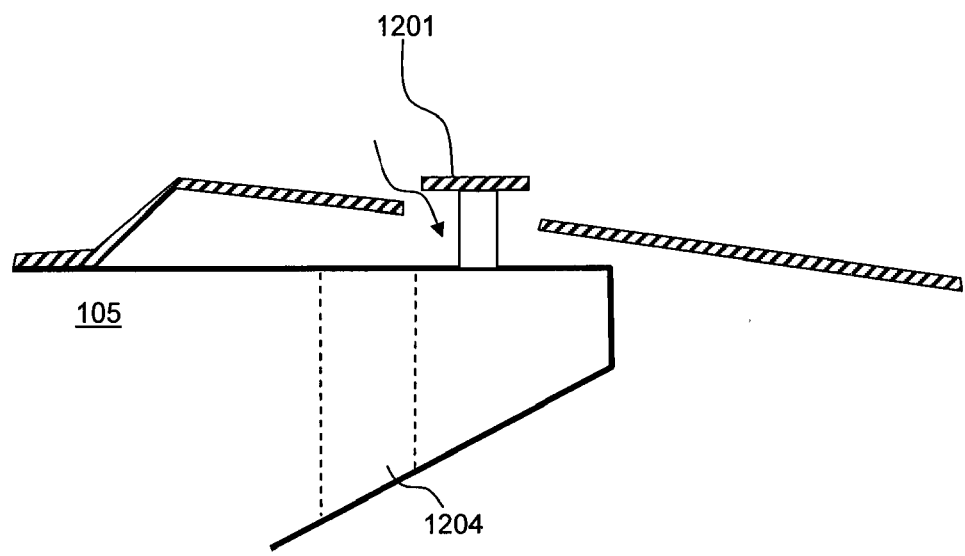
Figure 12C:
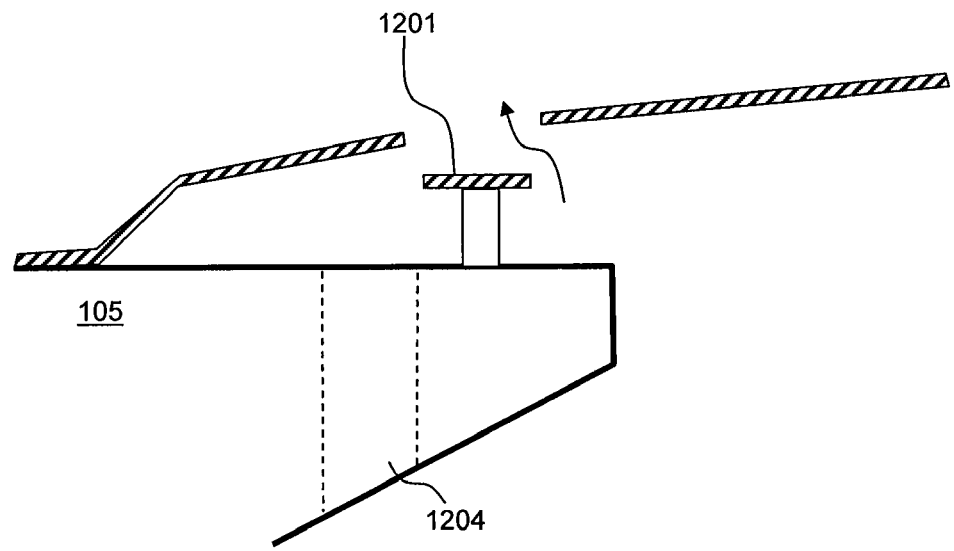

FIG. 12b shows the situation with the membrane deflected downwards (with the backplate omitted for clarity). It can be seen that membrane has moved out of plane of the plug thus opening a flow path through the hole in the membrane for flow of air as illustrated by the arrow. FIG. 12c shows the situation where the membrane is deflected upwards. The size of the flow path, or acoustic conductance (or acoustic impedance) will depend on the degree of deflection of the membrane 101 which in turn depends on the pressure difference across the membrane. Thus at low pressures, with a relatively low membrane deflection, there will be limited opening of the flow path, and thus the presence of the vent will not significantly impact on the operation of the transducer. At high pressure differentials such as resulting from high pressure events where there is significant membrane deflection there will be a significant opening of the vent and thus the pressure difference will rapidly reduce as described previously as the volumes on either side of the membrane equalise in pressure.

The extent of deflection required for the vent to open may be partly controlled by controlling the thickness of the plug section 1201. As shown in FIG. 12 the plug section may have the same thickness as the membrane layer—this may ease manufacturing as will be described below. In other embodiments however the plug section may be thicker than the membrane layer so that the membrane must deflect by a large amount to clear the plug section and thus provide significant opening of the vent.

It will be appreciated that for air to flow when the membrane is deflected downwards the supporting structure 1202 must not block the hole in the membrane 101. This may be achieved by ensuring that the support structure 1202 comprises one or more columns or pillars that has a cross sectional area (in a plane parallel to the membrane 101) which is less than that of the plug area, thus allowing air flow around the support columns. Additionally or alternatively however one or more holes could be provided through the support structure 1202. For example the support structure could comprise a frame having one or more open windows to allow air to flow through the support structure.

In the embodiment shown in FIG. 12 where the plug section is supported from the substrate 105 the relatively small gap between the membrane 101 and substrate 101 may limit the amount of air flow from the volume under the membrane. This may limit the maximum acoustic conductance of the vent even when largely open. Thus in some embodiments there may be one or more channels or apertures 1204 extending from the volume defined by the substrate 105 to the vicinity of the vent.

The structure shown in FIG. 12a may be manufactured using standard processing techniques with the addition of a few extra process steps. As mentioned typically the membrane layer 101 is deposited on an appropriately shaped layer of sacrificial material which has been deposited on the substrate. In one arrangement the support structures could be fabricated in one or more deposition steps prior to depositing the sacrificial material used to define the cavity under the membrane layer. The top of the support structure may be exposed at the top of the sacrificial material. Alternatively the sacrificial material may be deposited and patterned to reveal spaces for the support structure. Material forming the support structure could then be deposited and etched appropriately so that the support structure extends through the sacrificial material where required. A frame structure could be provided by depositing the support structure and sacrificial material in several steps.

A layer of material such as silicon nitride suitable for the membrane may then be deposited on the sacrificial material and top of the support structures. A channel could then be etched to separate the membrane layer from the plug section. When subsequently the sacrificial material is removed the membrane will be freely supported at the side walls to be flexible and the plug section will be supported to be largely fixed in position. Any channel through the substrate may be etched as part of the back-etch process.

It will be appreciated that the presence of the support structure 1202 on the substrate side of the membrane layer does mean that the flow path when the membrane is defected downwards is not as large as the flow path when the membrane is deflected upwards by a similar amount. Thus may result in a slight difference in response time of the vent to a given pressure differential depending on which side is at high pressure.

Figure 13:
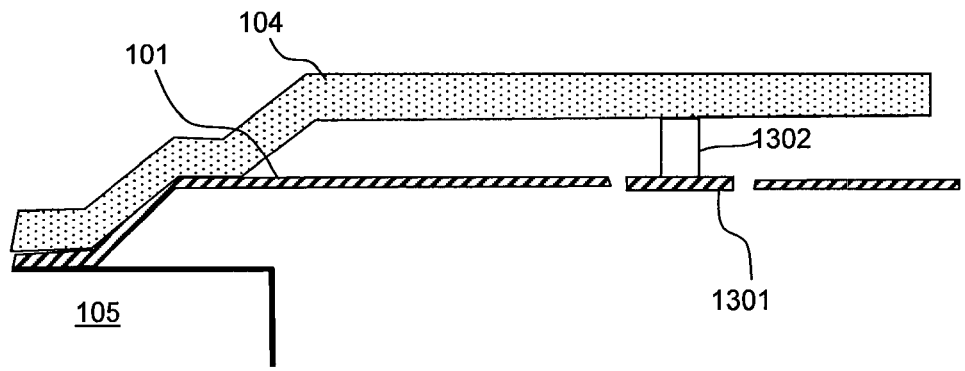
FIG. 13 illustrates another embodiment of a variable vent structure.

FIG. 13 shows an alternative embodiment which is similar to that shown in FIG. 12 but wherein a plug section 1301 is supported from the back-plate 1302 by a support structure 1302. This structure will operate in a similar fashion to that described with reference to FIG. 12, but has the advantages that the vent is located away from the substrate 105 and thus there is no impediment to flow from the volume below the substrate and also the vent may be located in an area of greater membrane deflection thus providing a larger flow path at high membrane deflections.

This structure may be fabricated in a similar way to that described above but with depositing the membrane layer and etching a channel to isolate plug section 1301 from the rest of the membrane layer prior to forming support structure 1302. Support structure 1302 may then be formed in a similar manner to that described above to provide a support structure extending through the sacrificial material used to define the upper cavity prior to depositing the material of the back-plate layer.

One or more transducers according to the any of the embodiments described above may be incorporated in a package. FIGS. 14a to 14g illustrate various different packaging arrangements. FIGS. 14a to 14g each show one transducer element located in the package but it will be appreciated that in some embodiments there may be more one than transducer, e.g. a transducer array, and the various transducers may be formed on the same transducer substrate, i.e. a monolithic transducer substrate, or may be formed as separate transducers with separate transducer substrates each separate transducer substrate being bonded to a package substrate.

Figure 14A:
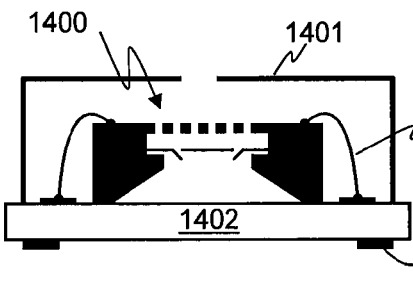

FIG. 14a shows a first arrangement where a transducer 1400 is located in a cover 1401, which forms at least part of a housing, on a package substrate 1402. The cover in this example could be a metallic housing which is bonded to the substrate. The package substrate may comprise at least one insulating layer. The package substrate may also comprise at least one conductive layer. The package substrate may be a semiconductor material or may be formed from a material such as PCB, ceramic or the like. Where the cover 1401 is metallic or itself comprises a conductive layer the cover may be electrically coupled to the conductive layer of the substrate, e.g. so that the housing provides shielding for electromagnetic interference (EMI). Bond wires 1403 may connect the transducer to bond pads on the package substrate. In some embodiments, read-out circuitry, for instance amplifier circuitry, may be located within the housing formed in or connected to the package substrate. Through vias through the package substrate (not illustrated) may connect to contacts, i.e. solder pads, 1404 for electrically connecting external circuitry (not illustrated) to the package to allow transmission of electrical signals to/from the transducer 1400. In the example shown in FIG. 14a there is a sound port or acoustic port in the cover 1401 to allow sound to enter the package and the transducer is arranged in a top port arrangement.

Figure 14B:
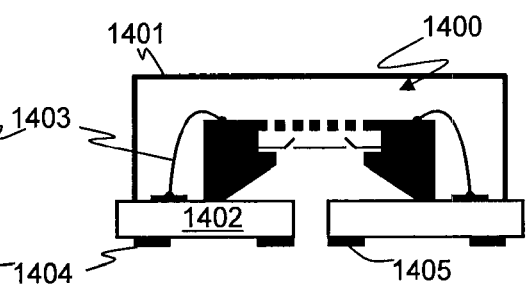

FIG. 14b illustrates an alternative arrangement where the sound port is provided in the package substrate 1402 and may, in use, be sealed. A ring 1405, which may be a sealing ring or a solder pad ring (for use in forming a solder ring) may be provided around the periphery of the sound port on the outer side of the package to allow, in use, sealing of a sound path leading to the sound port when the package is connected to another PCB for example. In this embodiment the transducer is arranged in a bottom port arrangement with the volume defined by the housing 1401 forming part of the back-volume of the transducer.

Figure 14C:
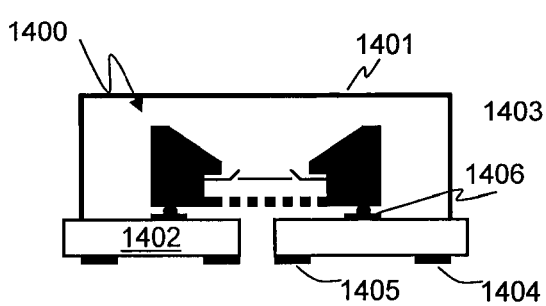

FIG. 14c illustrates an example where instead of bond wires connecting the transducer to the package substrate the transducer structure is inverted and flip-chip bonded to package substrate via connections 1406. In this example the sound port is in the package substrate such that the package is arranged in a bottom port arrangement.

Figure 14D:
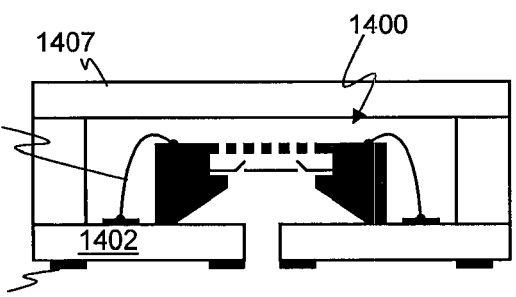
Figure 14E:
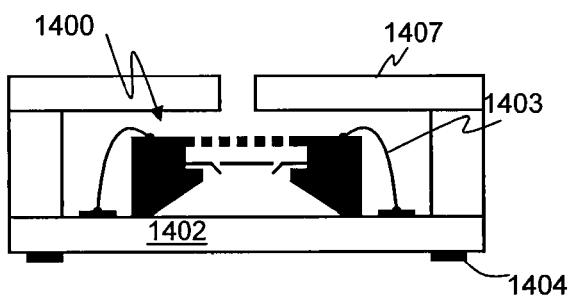
Figure 14F:
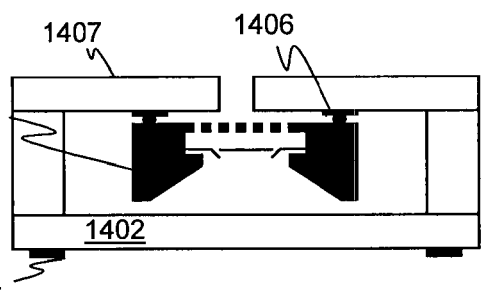

FIG. 14d illustrates an alternative example to that of FIG. 14b wherein a housing 1407 is formed from various panels of material, for example PCB or the like. In this instance the housing 1407 may comprise one or more conductive layers and/or one or more insulating layers. FIG. 14d shows the sound port in the package substrate. FIG. 14e shows an alternative arrangement to that of FIG. 14b wherein a housing 1407 is formed from various panels of material, for example PCB or the like as described in relation to FIG. 14d. FIG. 14f shows a further embodiment where the transducer structure is bonded via connections 1406 to the housing upper layer, which may for instance be PCB or layered conductive/insulating material. In this example however the electrical connections to the package are still via contacts, solder pads, 1404 on the package substrate, e.g. through vias (not illustrated) in the package substrate with conductive traces on the inside of the housing to the transducer. FIG. 14g illustrates an alternative example to that of FIG. 14c wherein a transducer is flip-chip bonded to the package substrate in a housing 1407 formed from panels of material, for example PCB or the like as described in relation to FIG. 14d.

In general, as illustrated in FIG. 14h, one or more transducers may be located in a package, the package is then operatively interconnected to another substrate, such as a mother-board, as known in the art.

In all embodiments the variable vent may act as a non-linear vent, which is a vent whose flow path size is not fixed and in which the extent to which the vent is open, and also flow rate through the vent, varies with pressure differential in a non-linear way as described above.

Generally, embodiments of the invention therefore relate to a MEMS transducer comprising at least one variable vent. More specifically, embodiments of the invention therefore relate to a MEMS transducer comprising a transducer structure including a flexible membrane supported between a first volume and a second volume and at least one variable vent structure. The variable vent structure may have at least one moveable portion which is moveable in response to a high pressure differential across the moveable portion so as to provide a flow path for venting fluid, e.g. gas from at least one of said first and second volumes. The variable vent may therefore comprise an aperture where the open size of the aperture varies with pressure differential.

The embodiments have been described in terms of venting air from a volume. The same principles apply to other gases and indeed other fluids, possibly including liquids. In some embodiments the transducer may be arranged in a sealed environment which is filled with a fluid other than air, the sealed environment being arranged to allow transmission of pressure waves to/from outside the sealed environment. There may still be large pressure differentials that can be generated within the sealed environment and the use of variable vents in such embodiments may be beneficial.

Embodiments of the present invention also relate to MEMS transducers comprising a flexible membrane, and at least one variable vent structure which is substantially closed in a first range of pressure differentials and which opens in a second higher range of pressure differentials to reduce the pressure differential across the membrane.

Embodiments of the present invention also relate to MEMS transducers comprising a flexible membrane supported between a first volume and a second volume and a vent structure connecting said first and second volumes. The vent provides a flow path having a size that varies with pressure differential across the membrane.

Embodiments of the present invention also relate to MEMS transducers comprising a flexible membrane supported between a first volume and a second volume and a vent connecting said first and second volumes wherein the vent is configured such that the flow rate through the vent is non-linear with respect to pressure difference.

Embodiments of the invention also relate to MEMS transducers having a membrane supported between first and second volumes wherein the acoustic impendence between the first and second volumes is variable with the differential pressure between the volumes.

Although the various embodiments describe a MEMS capacitive microphone, the invention is also applicable to any form of MEMS transducers other than microphones, for example pressure sensors or ultrasonic transmitters/receivers.

Embodiments of the invention may be usefully implemented using a range of different semiconductor-type material such a polysilicon for example. However the embodiments described herein are related to MEMS transducers having membrane layers comprising silicon nitride.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, laptops, mobile phones, tablets, PDAs and personal computers. Embodiments may also be used in voice activated or voice controlled devices. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

What is claimed is:

1. A MEMS transducer comprising:
    a flexible membrane the flexible membrane being moveable from an equilibrium position in response to a pressure differential across the membrane, wherein the flexible membrane has a first vent hole through the membrane; and
    a plug which is supported so as to lie within the first vent hole at said equilibrium position;
    wherein the flexible membrane is moveable with respect to the plug such that for at least one possible position of the flexible membrane, the plug does not lie within the first vent hole.

2. A MEMS transducer as claimed in claim 1 wherein the plug is supported by at least one support structure.

3. A MEMS transducer as claimed in claim 2 wherein the flexible membrane is suspended with respect to a substrate and said support structure extends from the substrate.

4. A MEMS transducer as claimed in claim 2 wherein the flexible membrane is suspended between a substrate and a back-plate structure and said support structure extends from the back-plate structure.

5. A MEMS transducer as claimed in claim 2 wherein the support structure comprises at least one support column wherein the at least one support column has a smaller cross sectional area than the plug.

6. A MEMS transducer as claimed in claim 2 wherein the support structure has one or more holes therein to allow air flow through the support structure.

7. A MEMS transducer as claimed in claim 1 wherein the plug has a thickness which is substantially the same thickness as the flexible membrane.

8. A MEMS transducer as claimed in claim 1 wherein the plug is configured so that the plug substantially blocks the whole of the first vent hole when the flexible membrane is at said equilibrium position.

9. A MEMS transducer as claimed in claim 1 wherein the plug is formed from the same material as the flexible membrane.

10. A MEMS transducer as claimed in claim 1 wherein: for positions of the flexible membrane which correspond to a first range of pressure differentials across the flexible membrane the plug lies at least partly within the first vent hole; and for positions of the flexible membrane which correspond to a second, higher, range of pressure differentials across the flexible membrane the plug does not lie within the first vent hole.

11. A MEMS transducer as claimed in claim 1 wherein there are a plurality of first vent holes through the flexible membrane, wherein for each first vent hole there is a corresponding plug which is supported so as to lie within the first vent hole at said equilibrium position of the flexible membrane.

12. A MEMS transducer as claimed in claim 1 further comprising at least one second hole through the flexible membrane wherein the second hole is open at said equilibrium position of the flexible membrane.

13. A MEMS transducer as claimed in claim 1 comprising a back-plate structure comprising a plurality of holes through the back-plate structure wherein the flexible membrane is supported with respect to said back-plate structure such that the position of at least one of said plurality of holes in the back-plate structure corresponds to the location of the first vent hole in the flexible membrane.

14. A MEMS transducer as claimed in claim 1 wherein said MEMS transducer comprises a MEMS microphone.

15. A MEMS transducer as claimed in claim 1 wherein said MEMS transducer forms part of an array of a transducer array.

16. A MEMS transducer as claimed in claim 15 wherein said transducer array is formed on a monolithic substrate.

17. A MEMS transducer as claimed in claim 1 wherein the transducer is located within a package having a sound port, wherein the package comprises a cover coupled to a package substrate.

18. A MEMS transducer as claimed in claim 1 wherein the transducer is located within a package having a sound port, wherein the package comprises a housing formed from panels of a first material.

19. An electronic device comprising a MEMS transducer as claimed in claim 1 wherein said electronic device is at least one of: a portable device; a battery powered device; an audio device; a computing device; a communications device; a personal media player; a mobile telephone; a games device; and a voice controlled device.

20. A method of fabricating a MEMS transducer having a flexible membrane, the method comprising:
    forming a structure having a flexible membrane supported between a first volume and a second volume;
    forming at least one first vent hole through said flexible membrane; and
    forming a plug which is supported to lie within said first vent hole when the flexible membrane is at an equilibrium position with no substantial pressure difference between said first and second volumes.

21. A method as claimed in claim 20 wherein forming said at least first vent hole through the flexible membrane and forming said plug comprises: forming a flexible membrane layer which contacts a support structure at a first location; and forming a channel through the flexible membrane layer to surround a first area of the flexible membrane layer that includes said first location so that the material in said first area forms said plug.

22. A MEMS transducer comprising:
    a flexible membrane; the flexible membrane being moveable from an equilibrium position in response to a pressure differential across the membrane, wherein the flexible membrane comprises at least one first vent hole through the flexible membrane; and a plug supported such that, when the flexible membrane is at the equilibrium position, at least part of the plug is located within the first vent hole to at least partly block a flow path through the first vent hole; and wherein the flexible membrane is moveable with respect to the plug to reduce the area of the vent hole which is blocked by said plug.

23. A MEMS transducer as claimed in claim 22 wherein at least one position of the flexible membrane the first vent hole is substantially unblocked by said plug.

24. A MEMS transducer comprising:

a flexible membrane; and at least one variable vent structure wherein said variable vent structure provides a flow path having a size that varies with pressure differential across the membrane;

wherein the variable vent structure comprises a moveable portion, which is moveable with respect to a fixed plug, wherein said moveable portion is moveable in response to a pressure differential across the membrane to expose said flow path.

* * * * *